(12) United States Patent
Kim et al.

(10) Patent No.: US 12,378,272 B2
(45) Date of Patent: Aug. 5, 2025

(54) YTTRIUM COMPOUND AND METHOD OF MANUFACTURING INTEGRATED CIRCUIT DEVICE BY USING THE SAME

(71) Applicant: SAMSUNG ELECTRONICS CO., LTD., Suwon-si (KR)

(72) Inventors: Hyunwoo Kim, Seoul (KR); Kazuki Harano, Tokyo (JP); Kiyoshi Murata, Tokyo (JP); Haruyoshi Sato, Tokyo (JP); Younsoo Kim, Yongin-si (KR); Seungmin Ryu, Hwaseong-si (KR); Atsushi Yamashita, Tokyo (JP); Gyuhee Park, Hwaseong-si (KR); Younjoung Cho, Hwaseong-si (KR)

(73) Assignees: SAMSUNG ELECTRONICS CO., LTD.; ADEKA CORPORATION, Tokyo (JP)

( * ) Notice: Subject to any disclaimer, the term of this patent is extended or adjusted under 35 U.S.C. 154(b) by 109 days.

(21) Appl. No.: 17/859,214

(22) Filed: Jul. 7, 2022

(65) Prior Publication Data

US 2023/0040334 A1    Feb. 9, 2023

(30) Foreign Application Priority Data

Jul. 9, 2021   (KR) .................. 10-2021-0090489
Nov. 3, 2021   (KR) .................. 10-2021-0149957

(51) Int. Cl.
C07F 17/00      (2006.01)
C23C 16/40      (2006.01)

(52) U.S. Cl.
CPC ............ *C07F 17/00* (2013.01); *C23C 16/405* (2013.01)

(58) Field of Classification Search
CPC ... H01L 21/02192; C23C 16/405; C07F 17/00
See application file for complete search history.

(56) References Cited

U.S. PATENT DOCUMENTS

| | | | |
|---|---|---|---|
| 4,882,206 A | * | 11/1989 | Erbil ............... C04B 41/81 427/255.31 |
| 6,858,546 B2 | | 2/2005 | Niinistöet al. |
| 7,557,229 B2 | | 7/2009 | Gordon et al. |
| 8,012,536 B2 | | 9/2011 | Shenai-Khatkhate et al. |
| 8,188,464 B2 | | 5/2012 | Quick |
| 8,283,201 B2 | | 10/2012 | Pallem et al. |

(Continued)

FOREIGN PATENT DOCUMENTS

| | | |
|---|---|---|
| JP | 2003-055093 A | 2/2003 |
| JP | 2011-522833 A | 8/2011 |
| WO | WO 2006/012052 A2 | 2/2006 |

*Primary Examiner* — Alex A Rolland
(74) *Attorney, Agent, or Firm* — Muir Patent Law, PLLC

(57) ABSTRACT

An yttrium compound and a method of manufacturing an integrated circuit device, the compound being represented by General Formula (I):

[General Formula (I)]

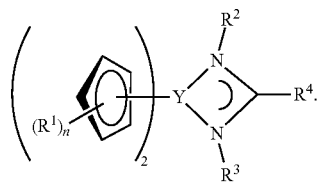

11 Claims, 7 Drawing Sheets

(56) References Cited

U.S. PATENT DOCUMENTS

| | | |
|---|---|---|
| 8,617,649 B2 | 12/2013 | Dussarrat et al. |
| 10,913,754 B2 | 2/2021 | Park et al. |
| 2012/0156373 A1* | 6/2012 | Pallem .................. C07C 257/12 |
| | | 257/E21.24 |
| 2019/0152996 A1* | 5/2019 | Park .................... H01L 21/0228 |

* cited by examiner

YTTRIUM COMPOUND AND METHOD OF MANUFACTURING INTEGRATED CIRCUIT DEVICE BY USING THE SAME

CROSS-REFERENCE TO RELATED APPLICATIONS

This application is based on and claims priority under 35 U.S.C. § 119 to Korean Patent Application No. 10-2021-0090489, filed on Jul. 9, 2021, and Korean Patent Application No. 10-2021-0149957, filed on Nov. 3, 2021, in the Korean Intellectual Property Office, the disclosures of which are incorporated herein in their entirety by reference.

BACKGROUND

1. Field

Embodiments relate to an yttrium compound and a method of manufacturing an integrated circuit device by using the yttrium compound.

2. Description of the Related Art

Due to the development of electronic technology, semiconductor devices have been rapidly down-scaled in recent years, and thus, patterns constituting electronic devices have been made finer in size.

SUMMARY

The embodiments may be realized by providing an yttrium compound represented by General Formula (I):

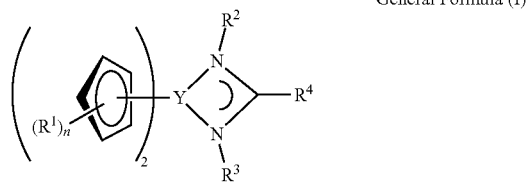

General Formula (I)

wherein, in General Formula (I), $R^1$ is a C1-C5 linear or branched alkyl group, $R^2$ and $R^3$ are each a C1-C8 linear or branched alkyl group, $R^2$ having a structure different than that of $R^3$, $R^4$ is a hydrogen atom or a C1-C5 linear or branched alkyl group, and n is an integer of 0 to 5.

The embodiments may be realized by providing a method of manufacturing an integrated circuit device, the method including forming an yttrium-containing film on a substrate by using an yttrium compound represented by General Formula (I), General Formula (I)

wherein, in General Formula (I), $R^1$ is a C1-C5 linear or branched alkyl group, $R^2$ and $R^3$ are each a C1-C8 linear or branched alkyl group, $R^2$ having a structure different than that of $R^3$, $R^4$ is a hydrogen atom or a C1-C5 linear or branched alkyl group, and n is an integer of 0 to 5.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
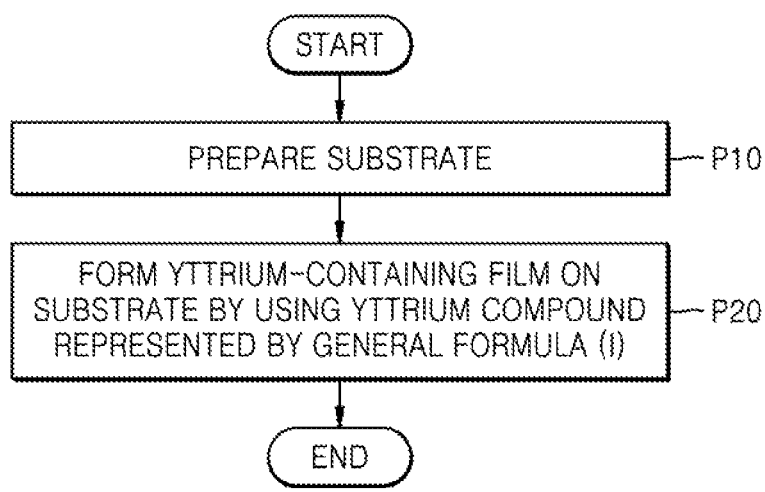
FIG. 1 is a flowchart of a method of manufacturing an integrated circuit device, according to embodiments.

As used herein, the term "substrate" may refer to a substrate itself, or a stack structure including a substrate and a certain layer or film or the like formed on a surface of the substrate. In addition, as used herein, the term "surface of a substrate" may refer to an exposed surface of the substrate itself, or an outer surface of a certain layer or film or the like formed on the substrate. As used herein, the abbreviation "Me" refers to a methyl group, the abbreviation "Et" refers to an ethyl group, the abbreviation "nPr" refers to a normal propyl group, the abbreviation "iPr" refers to an isopropyl group, the abbreviation "nBu" refers to a normal butyl group or a linear butyl group, the abbreviation "sBu" refers to a sec-butyl group (1-methylpropyl group), the abbreviation "iBu" refers to an isobutyl group (2-methylpropyl group), the abbreviation "tBu" refers to a tert-butyl group (1,1-dimethylethyl group), and the abbreviation "Cp" refers to a cyclopentadienyl group. As used herein, the term "room temperature" refers to a temperature ranging from about 20° C. to about 28° C., and may vary with seasons. As used herein, the term "or" is not an exclusive term, e.g., "A or B" would include A, B, or A and B. As used herein, all substitutable groups may be substituted or unsubstituted.

An yttrium compound according to an embodiment may be represented by General Formula (I).

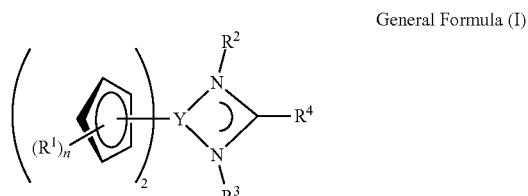

[General Formula (I)]

In General Formula (I), $R^1$ may be or may include, e.g., a C1-C5 linear or branched alkyl group.

$R^2$ and $R^3$ may each independently be or include, e.g., a C1-C8 linear or branched alkyl group. In an implementation, $R^2$ may have a structure that is different from that of $R^3$.

$R^4$ may be or may include, e.g., a hydrogen atom or a C1-C5 linear or branched alkyl group.

n may be, e.g., an integer of 0 to 5.

In an implementation, $R^1$ may include, e.g., a methyl group, an ethyl group, a normal propyl group, an isopropyl group, a normal butyl group, an isobutyl group, a sec-butyl group, a tert-butyl group, a normal pentyl group, an isopentyl group, or a neopentyl group.

In an implementation, each of $R^2$ and $R^3$ may include, e.g., a methyl group, an ethyl group, a normal propyl group, an isopropyl group, a normal butyl group, an isobutyl group, a sec-butyl group, a tert-butyl group, a normal pentyl group, an isopentyl group, a neopentyl group, a hexyl group, a heptyl group, a 3-heptyl group, an isoheptyl group, a tert-heptyl group, an octyl group, an isooctyl group, a tert-octyl group, or a 2-ethylhexyl group.

In an implementation, in General Formula (I), n may be suitably selected according to a purpose of applying a compound represented by General Formula (I). In a manufacturing process of a thin film, which includes a process of vaporizing the compound represented by General Formula (I), the compound having a relatively high vapor pressure and a relatively low melting point may be used. In an effort to help ensure that the compound represented by General Formula (I) exhibits a lower melting point and a higher vapor pressure, $R^1$ may be, e.g., a C1-C3 alkyl group. In an implementation, $R^1$ may be, e.g., a methyl group or an ethyl group. In an effort to help ensure that the compound represented by General Formula (I) exhibits better thermal stability and to help ensure a high-quality thin film when used as a source material for thin film formation, each of $R^2$ and $R^3$ may be, e.g., a C1-C5 alkyl group. In an implementation, each of $R^2$ and $R^3$ may be, e.g., an ethyl group or an isopropyl group. In an effort to help ensure that the compound represented by General Formula (I) exhibits a relatively low melting point and better thermal stability, $R^4$ may be, e.g., a hydrogen atom or a C1-C3 alkyl group. In an implementation, $R^4$ may be, e.g., a hydrogen atom, a methyl group, or an ethyl group. In an effort to help ensure that the compound represented by General Formula (I) exhibits better thermal stability, n may be, e.g., 0, 1, 2, or 5. In an implementation, n may be, e.g., 0 or 1. In a manufacturing process of a thin film, which does not include a process of vaporizing the compound represented by General Formula (I), each of $R^1$, $R^2$, $R^3$, $R^4$, and n in General Formula (I) may be selected according to the solubility in a solvent in use, a thin-film forming reaction, or the like.

In an implementation, in General Formula (I), at least one of $R^2$ and $R^3$ may be, e.g., a C3-C4 branched alkyl group.

In an implementation, in General Formula (I), n may be, e.g., 0 or 1.

In an implementation, in General Formula (I), a number of carbon atoms in $R^4$ may be less than a number of carbon atoms in each of $R^2$ and $R^3$.

In an implementation, $R^4$ in General Formula (I) may be, e.g., a hydrogen atom or a methyl group.

In an implementation, in General Formula (I), each of $R^2$ and $R^3$ may include at least one carbon atom. In an implementation, a number of carbon atoms in $R^2$ may be different from a number of carbon atoms in $R^3$.

In an implementation, in General Formula (I), one of $R^2$ and $R^3$ may be, e.g., a C3-C4 branched alkyl group, and the other one of $R^2$ and $R^3$ may be, e.g., a C1-C4 linear alkyl group.

In an implementation, in General Formula (I), $R^2$ and $R^3$ may each independently be, e.g., Et, nPr, iPr, iBu, sBu, or tBu.

In an implementation, the compound represented by General Formula (I) may be a liquid at room temperature (e.g., and at atmospheric pressure). In an implementation, the compound represented by General Formula (I) may be a liquid at about 20° C.

The yttrium compound according to an embodiment may provide or exhibit excellent thermal stability. In an implementation, when the yttrium compound according to an embodiment is used as an yttrium precursor in a chemical vapor deposition (CVD) process or an atomic layer deposition (ALD) process, the yttrium compound may be stably transported without decomposition thereof due to heat while being transported from a storage container to a reaction chamber. In an implementation, when the yttrium compound according to an embodiment has been transported to a deposition reaction chamber for forming an yttrium-containing film, the yttrium compound may be easily decomposed by a process temperature in the reaction chamber and thus may have no effect on a surface reaction for forming the yttrium-containing film. In an implementation, when the yttrium-containing film is formed using the yttrium compound according to an embodiment, because a phenomenon, in which undesired foreign materials such as carbon residue remain in the yttrium-containing film, is suppressed, the yttrium-containing film with good quality may be formed, and the productivity of a manufacturing process of an integrated circuit device including the yttrium-containing film may be improved.

In an implementation, the yttrium compound according to an embodiment may be represented by, e.g., one of the following Formulae 1 to 132.

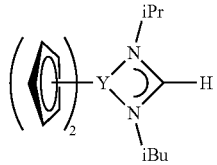

Formula 1

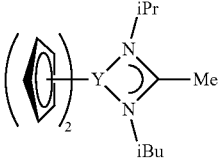

Formula 2

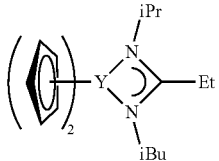

Formula 3

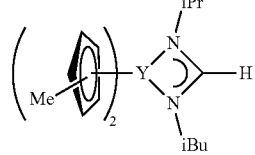

Formula 4

-continued
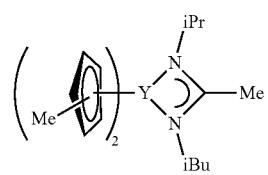
Formula 5
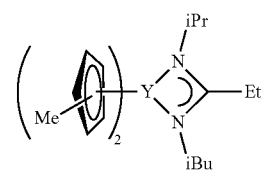
Formula 6
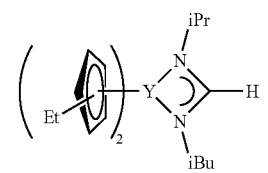
Formula 7
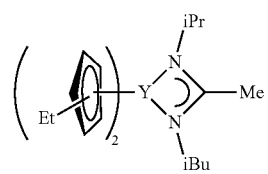
Formula 8
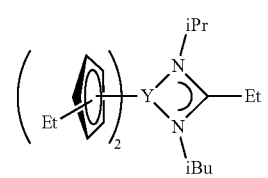
Formula 9
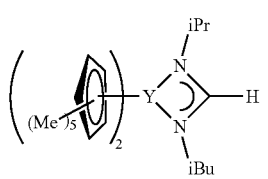
Formula 10
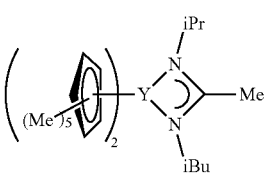
Formula 11
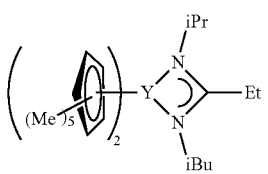
Formula 12
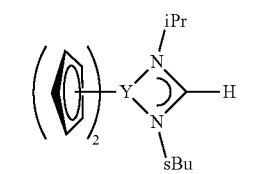
Formula 13
-continued
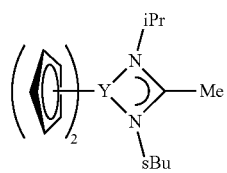
Formula 14
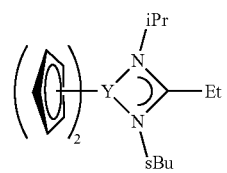
Formula 15
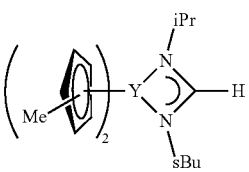
Formula 16
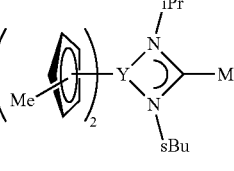
Formula 17
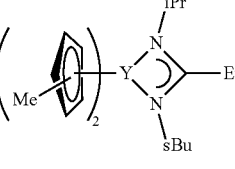
Formula 18
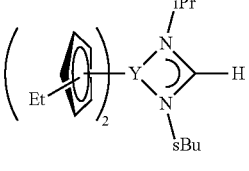
Formula 19
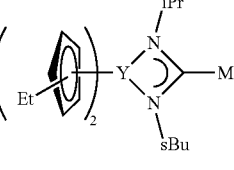
Formula 20
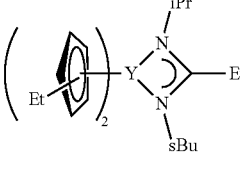
Formula 21
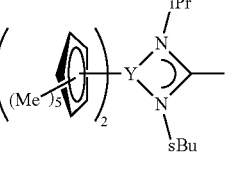
Formula 22

Formula 23
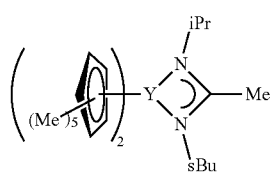
Formula 24
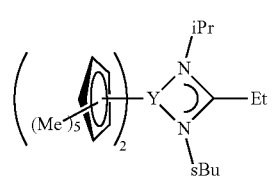
Formula 25
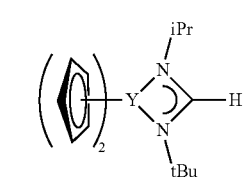
Formula 26
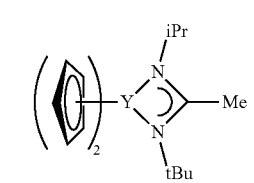
Formula 27
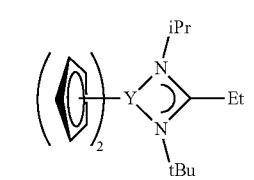
Formula 28
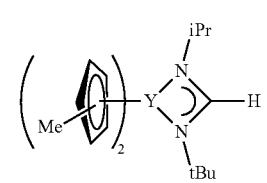
Formula 29
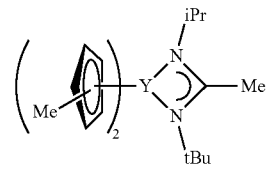
Formula 30
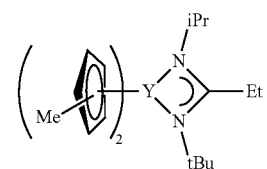
Formula 31
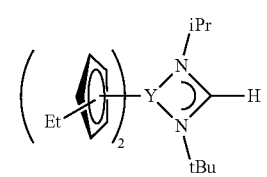
Formula 32
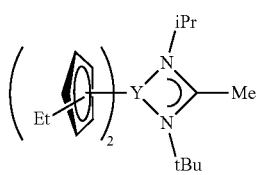
Formula 33
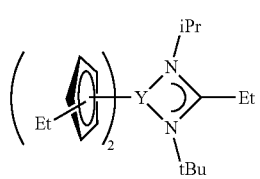
Formula 34
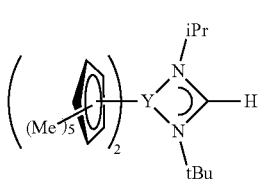
Formula 35
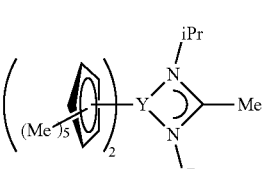
Formula 36
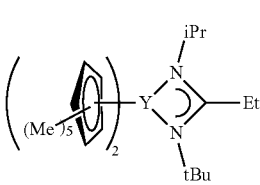
Formula 37
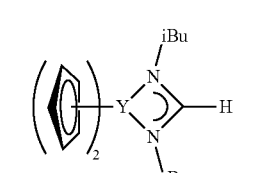
Formula 38
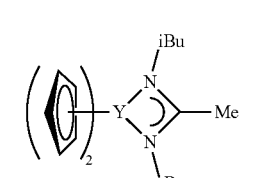
Formula 39
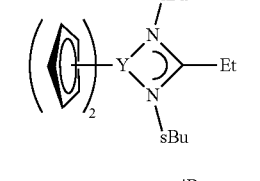
Formula 40
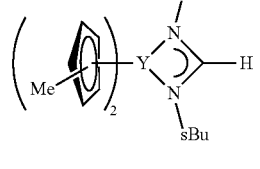

-continued
Formula 41
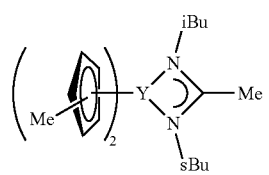
Formula 42
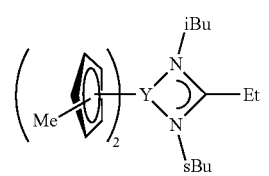
Formula 43
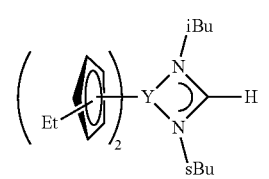
Formula 44
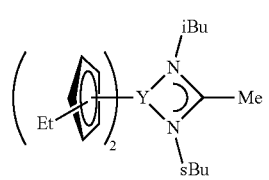
Formula 45
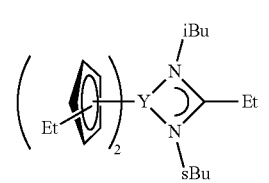
Formula 46
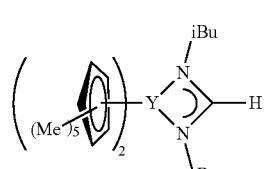
Formula 47
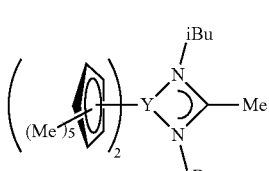
Formula 48
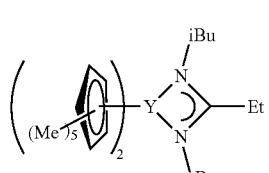
Formula 49
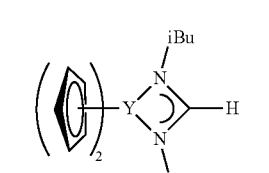
-continued
Formula 50
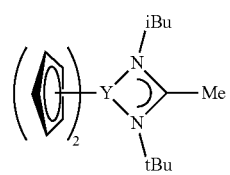
Formula 51
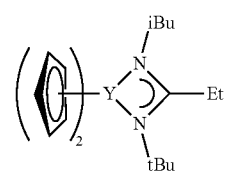
Formula 52
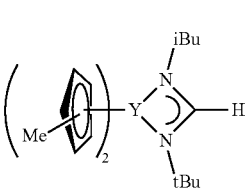
Formula 53
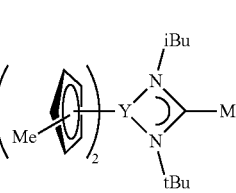
Formula 54
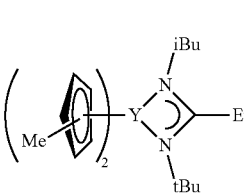
Formula 55
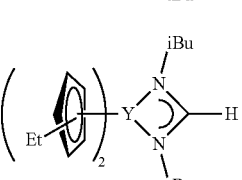
Formula 56
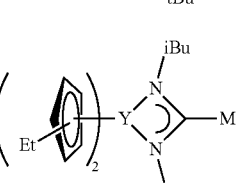
Formula 57
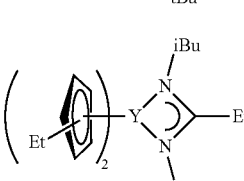
Formula 58
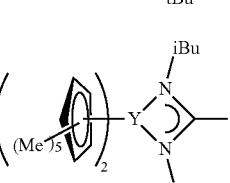

| | | |
|---|---|---|
| 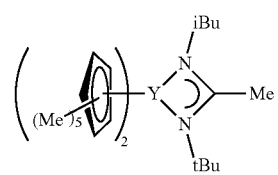 | Formula 59 | |
| 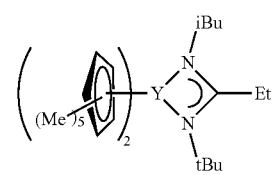 | Formula 60 | |
| 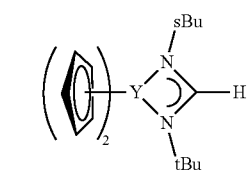 | Formula 61 | |
| 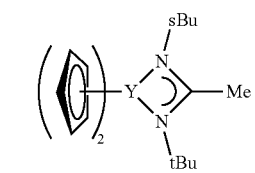 | Formula 62 | |
| 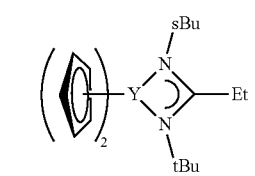 | Formula 63 | |
| 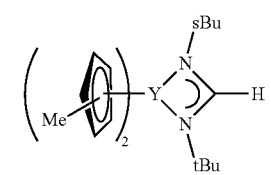 | Formula 64 | |
| 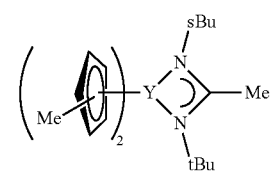 | Formula 65 | |
| 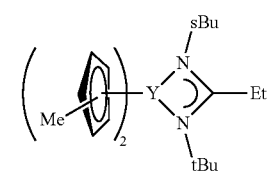 | Formula 66 | |
| 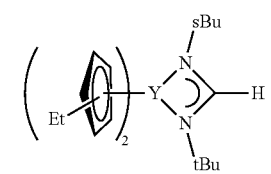 | Formula 67 | |
| 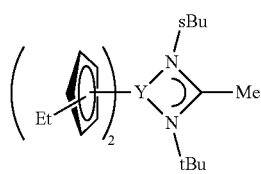 | Formula 68 | |
| 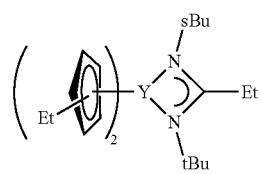 | Formula 69 | |
| 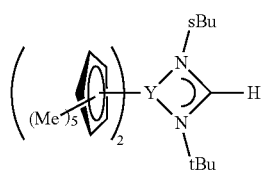 | Formula 70 | |
| 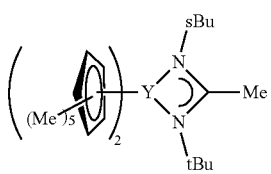 | Formula 71 | |
| 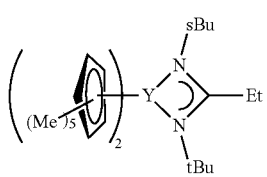 | Formula 72 | |
| 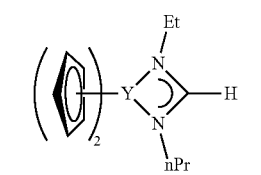 | Formula 73 | |
| 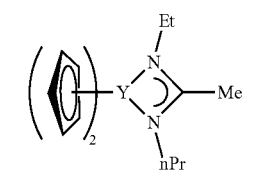 | Formula 74 | |
| 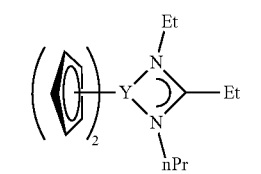 | Formula 75 | |
| 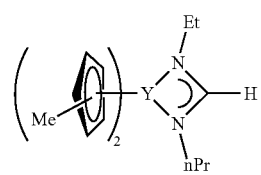 | Formula 76 | |

-continued
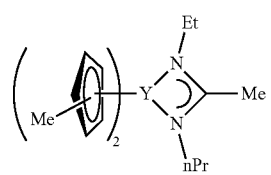
Formula 77
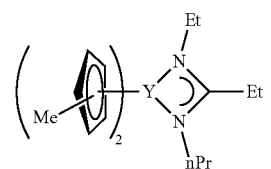
Formula 78
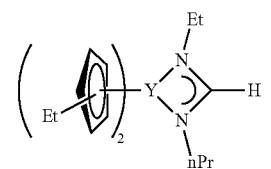
Formula 79
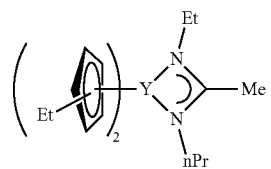
Formula 80
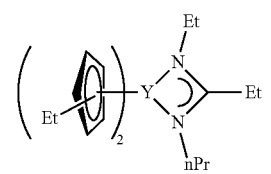
Formula 81
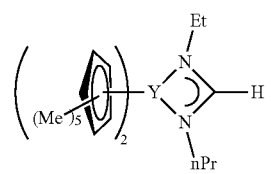
Formula 82
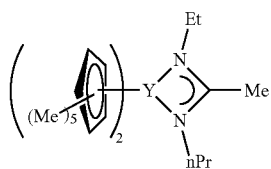
Formula 83
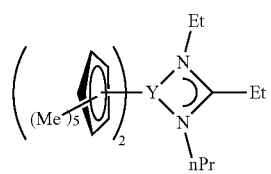
Formula 84
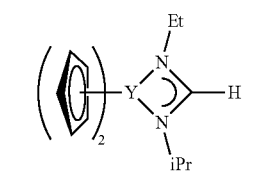
Formula 85
-continued
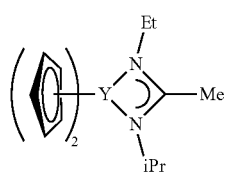
Formula 86
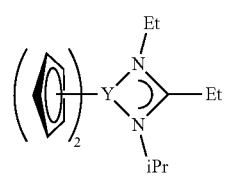
Formula 87
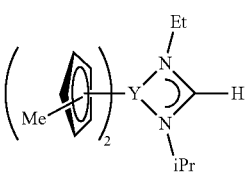
Formula 88
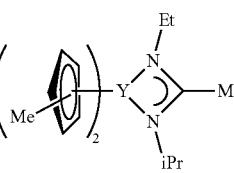
Formula 89
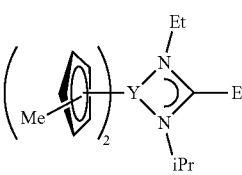
Formula 90
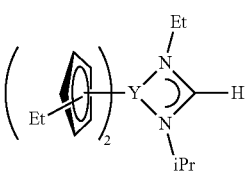
Formula 91
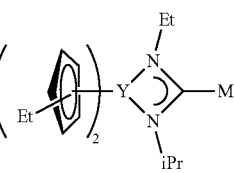
Formula 92
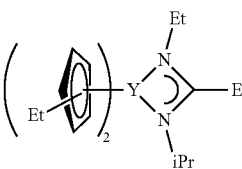
Formula 93
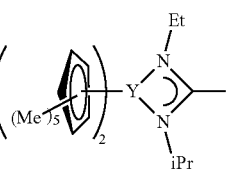
Formula 94

-continued
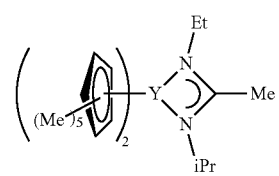
Formula 95
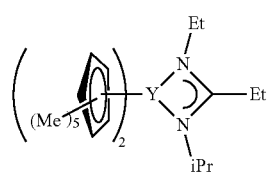
Formula 96
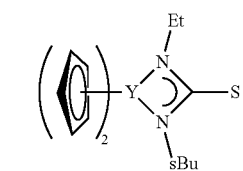
Formula 97
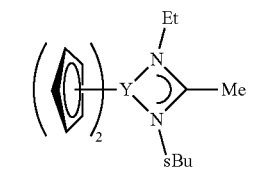
Formula 98
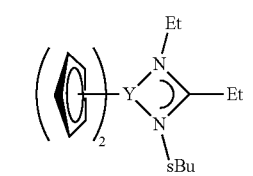
Formula 99
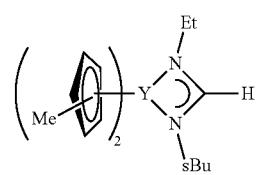
Formula 100
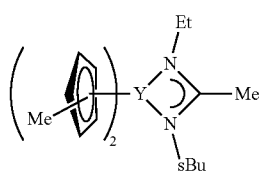
Formula 101
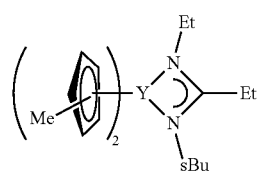
Formula 102
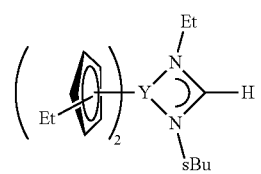
Formula 103
-continued
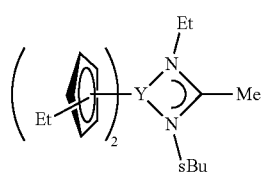
Formula 104
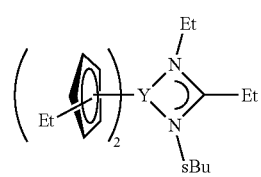
Formula 105
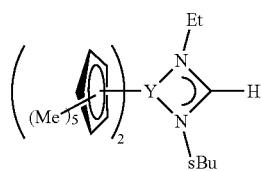
Formula 106
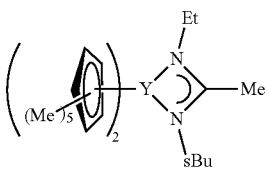
Formula 107
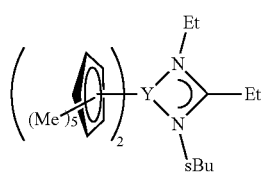
Formula 108
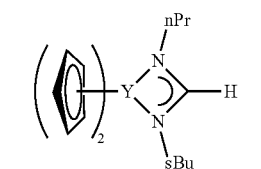
Formula 109
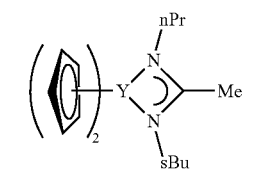
Formula 110
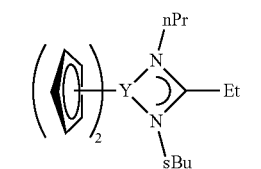
Formula 111
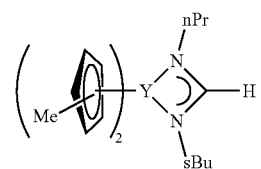
Formula 112

-continued
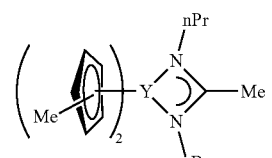
Formula 113
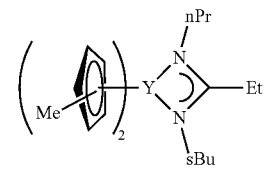
Formula 114
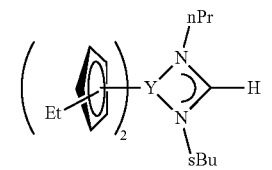
Formula 115
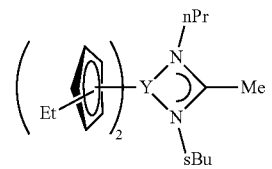
Formula 116
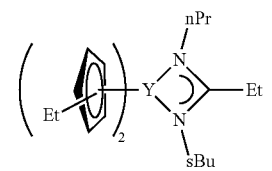
Formula 117
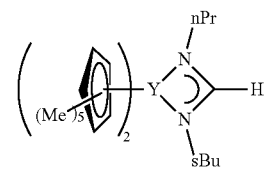
Formula 118
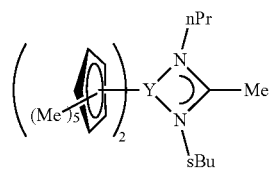
Formula 119
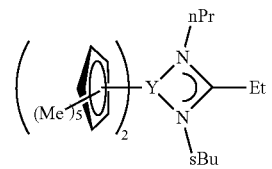
Formula 120
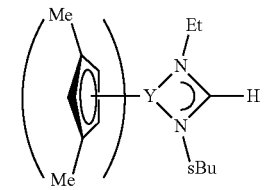
Formula 121
-continued
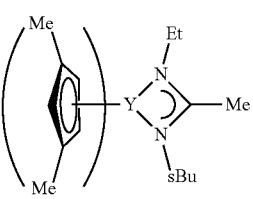
Formula 122
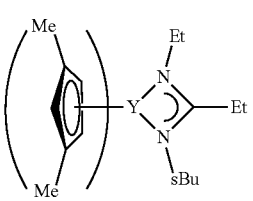
Formula 123
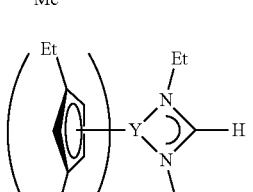
Formula 124
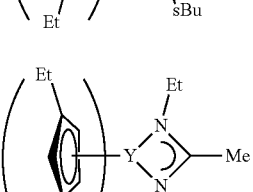
Formula 125
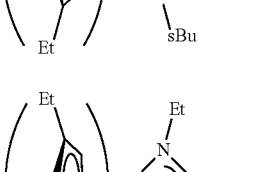
Formula 126
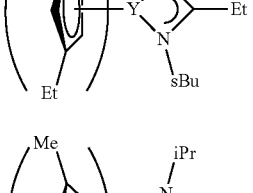
Formula 127
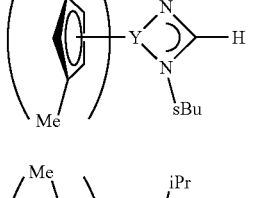
Formula 128
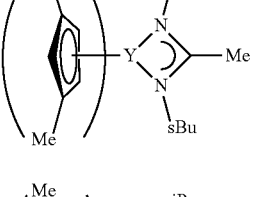
Formula 129
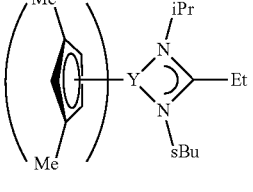

-continued

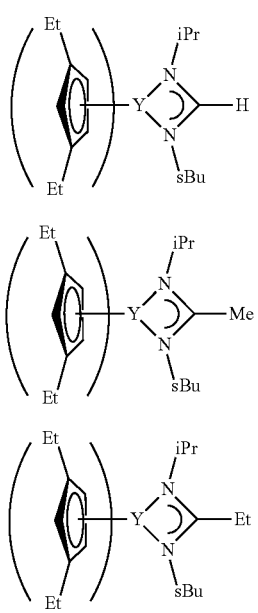

Formula 130

Formula 131

Formula 132

In an implementation, the yttrium compound represented by General Formula (I) may be synthesized by using suitable reactions. In an implementation, in a hexane solvent atmosphere, an yttrium-cyclopentadienyl compound, which has a structure including a desired $R^1$ group, may be reacted with an amidinate compound, which has a structure including $R^2$, $R^3$, and $R^4$ groups, and then, an obtained reaction solution may undergo solvent removal and purification by distillation, thereby obtaining the yttrium compound represented by General Formula (I).

The yttrium compound according to embodiments may be used as a source material suitable for a CVD process or an ALD process.

FIG. 1 is a flowchart of a method of manufacturing an integrated circuit device, according to embodiments.

Referring to FIG. 1, in a process P10, a substrate is prepared.

The substrate may include, e.g., a semiconductor, ceramics, glass, a metal, a metal nitride, or a combination thereof. The semiconductor may include, e.g., an elemental semiconductor such as Si or Ge, or a compound semiconductor such as SiGe, SiC, GaAs, InAs, or InP. The ceramics may include, e.g., silicon nitride, titanium nitride, tantalum nitride, titanium oxide, niobium oxide, zirconium oxide, hafnium oxide, lanthanum oxide, or a combination thereof. Each of the metal and the metal nitride may include, e.g., Ti, Ta, Co, Ru, Zr, Hf, La, or a combination thereof. A surface of the substrate may have, e.g., a flat shape, a spherical shape, a fibrous shape, or a scale-like shape. In an implementation, the surface of the substrate may have a 3-dimensional structure such as a trench structure or the like.

In a process P20 of FIG. 1, an yttrium-containing film may be formed on the substrate by using a source material for yttrium-containing film formation, which includes, e.g., the yttrium compound represented by General Formula (I).

The source material for yttrium-containing film formation may include the yttrium compound according to an embodiment. In an implementation, the source material for yttrium-containing film formation may include, e.g., an yttrium compound represented by one of Formulae 1 to 132.

In an implementation, the source material for yttrium-containing film formation may not include other metal compounds and semimetal compounds, in addition to the yttrium compound represented by General Formula (I).

In an implementation, the yttrium-containing film to be formed may further include another metal in addition to yttrium. In an implementation, when the yttrium-containing film to be formed is a film further including another metal or semimetal in addition to yttrium, the source material for yttrium-containing film formation may include a compound (referred to as "another precursor" hereinafter) including the desired metal or semimetal in addition to the yttrium compound according to an embodiment. In an implementation, the source material for yttrium-containing film formation may further include, e.g., an organic solvent or a nucleophilic reagent in addition to the yttrium compound according to embodiments.

To form the yttrium-containing film according to the process P20 of FIG. 1, a CVD process or an ALD process may be used. The source material for yttrium-containing film formation, which includes the yttrium compound according to the embodiments, may be suitably used for a chemical deposition process such as a CVD process or an ALD process.

When the source material for yttrium-containing film formation is used for a chemical vapor deposition process, a composition of the source material for yttrium-containing film formation may be appropriately selected according to a transport method of the source material. The transport method of the source material may include, e.g., a vapor transport method or a liquid transport method. In the vapor transport method, the source material for yttrium-containing film formation may be in a vapor state by vaporizing the source material through heating or decompression of the source material within a container (which may be referred to as "source material container" hereinafter) in which the source material is stored, and the source material in a vapor state, together with a carrier gas, e.g., argon, nitrogen, helium, or the like used as needed, may be introduced into a chamber (which may be referred to as "deposition reactor" hereinafter) in which the substrate is arranged. In the liquid transport method, the source material may be transported, in a liquid or solution state, to a vaporization chamber and make a vapor by heating or decompression thereof in the vaporization chamber, and then, the vapor may be introduced into the chamber.

When the vapor transport method is used to form the yttrium-containing film according to the process P20 of FIG. 1, the yttrium compound itself represented by General Formula (I) may be used as the source material for yttrium-containing film formation. When the liquid transport method is used to form the yttrium-containing film according to the process P20 of FIG. 1, the yttrium compound itself represented by General Formula (I), or a solution in which the yttrium compound represented by General Formula (I) is dissolved in an organic solvent, may be used as the source material for yttrium-containing film formation. The source material for yttrium-containing film formation may further include, e.g., another precursor, a nucleophilic reagent, or the like.

In an implementation, to form the yttrium-containing film in accordance with the method of manufacturing an integrated circuit device according to an embodiment, a multi-component chemical deposition method may be used. In the multi-component chemical deposition method, a method (which may be referred to as "single source method" hereinafter) in which each component of the source material for yttrium-containing film formation is independently vaporized and supplied, or a method (which may be referred to as "cocktail source method" hereinafter) in which a mixed source material obtained by mixing multiple components in a desired composition in advance, may be used. When the cocktail source method is used, a mixture of the yttrium compound according to an embodiment and the other precursor, or a mixed solution in which the mixture is dissolved in an organic solvent may be used as the source material for yttrium-containing film formation. The mixture or the mixed solution may further include, e.g., a nucleophilic reagent.

The organic solvent may include suitable organic solvents. In an implementation, the organic solvent may include, e.g., acetic acid esters such as ethyl acetate, butyl acetate, or methoxyethyl acetate; ethers such as tetrahydrofuran, tetrahydropyran, ethylene glycol dimethyl ether, triethylene glycol dimethyl ether, or dibutyl ether; ketones such as methyl butyl ketone, methyl isobutyl ketone, ethyl butyl ketone, dipropyl ketone, diisobutyl ketone, methyl amyl ketone, cyclohexanone, or methyl cyclohexanone; hydrocarbons such as hexane, cyclohexane, methylcyclohexane, dimethylcyclohexane, ethylcyclohexane, heptane, octane, toluene, or xylene; cyano group-containing hydrocarbons such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, or 1,4-dicyanobenzene; pyridine; lutidine; or the like. The organic solvents set forth above as examples may be used alone or as a mixed solvent of at least two thereof, by considering solubility of solutes, ambient temperatures, boiling points, flash points, or the like.

When the organic solvent is included in the source material for yttrium-containing film formation, which includes the yttrium compound according to an embodiment, the yttrium compound and the other precursor may be present, in the organic solvent, in a total amount or concentration of, e.g., about 0.01 mol/L to about 2.0 mol/L, or about 0.05 mol/L to about 1.0 mol/L. In an implementation, when the source material for yttrium-containing film formation does not include other metal compounds or semimetal compounds in addition to the yttrium compound, the total amount set forth above is an amount of the yttrium compound. In an implementation, when the source material for yttrium-containing film formation includes another metal compound or semimetal compound, e.g., the other precursor, in addition to the yttrium compound, the total amount set forth above is a sum of the amount of the yttrium compound and an amount of the other precursor.

In an implementation, when the multi-component chemical deposition method is used to form the yttrium-containing film in accordance with the method of manufacturing an integrated circuit device according to an embodiment, the other precursor capable of being used together with the yttrium compound may include other suitable precursors that are in use as source materials for yttrium-containing film formation.

In an implementation, the other precursor, which may be used to form the yttrium-containing film in accordance with the method of manufacturing an integrated circuit device according to the embodiments, may include at least one organic coordination compound, e.g., an alcohol compound, a glycol compound, a β-diketone compound, a cyclopentadiene compound, an organic amine compound, a silicon compound, or a metal compound.

In an implementation, the other precursor may include an element, e.g., lithium (Li), sodium (Na), potassium (K), magnesium (Mg), calcium (Ca), strontium (Sr), barium (Ba), titanium (Ti), zirconium (Zr), hafnium (Hf), vanadium (V), chromium (Cr), molybdenum (Mo), tungsten (W), manganese (Mn), iron (Fe), cobalt (Co), rhodium (Rh), iridium (Ir), nickel (Ni), platinum (Pt), copper (Cu), silver (Ag), gold (Au), zinc (Zn), aluminum (Al), germanium (Ge), tin (Sn), lead (Pb), antimony (Sb), bismuth (Bi), tantalum (Ta), niobium (Nb), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Ru), or lutetium (Lu).

In an implementation, the alcohol compound having an organic ligand of the other precursor may include, e.g., alkyl alcohols such as methanol, ethanol, propanol, isopropyl alcohol, butanol, sec-butyl alcohol, isobutyl alcohol, tert-butyl alcohol, pentyl alcohol, isopentyl alcohol, or tert-pentyl alcohol; ether alcohols such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, or 3-methoxy-1,1-dimethylpropanol; or dialakyl amino alcohols such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, or diethylamino-2-methyl-2-pentanol.

In an implementation, the glycol compound capable of being used as the organic coordination compound of the other precursor may include, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, or 2,4-dimethyl-2,4-pentanediol.

In an implementation, the β-diketone compound capable of being used as the organic coordination compound of the other precursor may include, e.g., alkyl-substituted β-diketones such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, or 2,2-dimethyl-6-ethyldecane-3,5-dione; fluorine-substituted alkyl β-diketones such as 1,1,1-trifluoropentane-2,4-dione, 1,1,1-trifluoro-5,5-dimethylhexane-2,4-dione, 1,1,1,5,5,5-hexafluoropentane-2,4-dione, or 1,3-diperfluorohexylpropane-1,3-dione; or ether-substituted β-diketones such as 1,1,5,5-tetramethyl-1-methoxyhexane-2,4-dione, 2,2,6,6-tetramethyl-1-methoxyheptane-3,5-dione, or 2,2,6,6-tetramethyl-1-(2-methoxyethoxy)heptane-3,5-dione.

In an implementation, the cyclopentadiene compound capable of being used as the organic coordination compound of the other precursor may include, e.g., cyclopentadiene, methylcyclopentadiene, ethylcyclopentadiene, propyl cyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene.

In an implementation, the organic amine compound capable of being used as the organic coordination compound of the other precursor may include, e.g., methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, or isopropylmethylamine.

In an implementation, when the alcohol compound is used as the organic ligand, the precursor may be manufactured by reacting an inorganic salt of the above-described element or a hydrate thereof with an alkaline metal alkoxide of the alcohol compound. In an implementation, examples of the inorganic salt of the above-described element or the hydrate thereof may include halides of metals, acetic acid, and the like. Examples of the alkaline metal alkoxide may include sodium alkoxides, lithium alkoxides, potassium alkoxides, and the like.

When the single source method is used, a compound having thermal or oxidative decomposition behaviors similar to those of the yttrium compound according to the embodiments may be used as the other precursor. When the cocktail source method is used, a compound, which has thermal/or oxidative decomposition behaviors similar to those of the yttrium compound according to the embodiments and is not deteriorated by a chemical reaction or the like in mixing, may be used as the other precursor.

In forming the yttrium-containing film in accordance with the method of manufacturing an integrated circuit device according to the embodiments, the source material for yttrium-containing film formation may include a nucleophilic reagent. The nucleophilic reagent may impart stability to the yttrium compound or the other precursor. The nucleophilic reagent may include, e.g., ethylene glycol ethers such as glyme, diglyme, triglyme, and tetraglyme; crown ethers such as 18-crown-6, dicyclohexyl-18-crown-6, 24-crown-8, dicyclohexyl-24-crown-8, or dibenzo-24-crown-8; polyamines such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, or triethoxytriethyleneamine; cyclic polyamines such as cyclam or cyclen; heterocyclic compounds such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, or oxathiolane; β-ketone esters such as methyl acetoacetate, ethyl acetoacetate, or 2-methoxyethyl acetoacetate; or β-diketones such asacetylacetone, 2,4-hexanedione, 2,4-heptanedione, 3,5-heptanedione, or dipivaloylmethane. The nucleophilic reagent may be present in an amount of about 0.1 mol to about 10 mol, e.g., about 1 mol to about 4 mol, based on 1 mol of a total amount of the precursor.

Amounts of metal element impurities, halogen impurities such as chlorine impurities or the like, and organic impurities may be suppressed as much as possible, in the source material for yttrium-containing film formation, which is used to form the yttrium-containing film in accordance with the method of manufacturing an integrated circuit device according to the embodiments. In an implementation, each of the metal element impurities may be present in an amount of about 100 ppb (by mass) or less in the source material for yttrium-containing film formation. In an implementation, each of the metal element impurities may be present in an amount of about 10 ppb or less in the metal element impurities, and the metal element impurities may be present in a total amount of about 1 ppm or less, e.g., about 100 ppb or less. In an implementation, when a thin film used as a gate insulating film, a gate conductive film, or a barrier film of a large-scale integrated circuit (LSI) is formed, amounts of alkaline metal elements and alkaline earth metal elements, which affect electrical properties of the obtained thin film, may be made as small as possible. In an implementation, the halogen impurities may be present in an amount of about 100 ppm or less, e.g., about 10 ppm or less or about 1 ppm or less, in the source material for yttrium-containing film formation.

The organic impurities may be present in a total amount of about 500 ppm or less, e.g., about 50 ppm or less, or about 10 ppm or less, in the source material for yttrium-containing film formation.

When water is present in the source material for yttrium-containing film formation, the water could cause the generation of particles in the source material or cause the generation of particles during the formation of the thin film. Thus, the precursor, the organic solvent, and the nucleophilic reagent may undergo water removal in advance before use thereof. Water may be present in an amount of about 10 ppm or less, e.g., about 1 ppm or less, in each of the precursor, the organic solvent, and the nucleophilic reagent.

In forming the yttrium-containing film in accordance with the method of manufacturing an integrated circuit, to reduce particle contamination in the yttrium-containing film intended to be formed, an amount of particles in the source material for yttrium-containing film formation may be minimized. In an implementation, when a particle measurement for a liquid phase is performed by a light scattering type particle detector, particles greater than 0.3 μm may be present in a number of 100 or less in 1 mL of a liquid of the source material for yttrium-containing film formation, and particles greater than 0.2 μm may be present in a number of 1,000 or less, e.g., 100 or less, in 1 mL of the liquid thereof.

In the process P20 of FIG. 1, to form the yttrium-containing film by using the source material for yttrium-containing film formation, the process P20 may include: a process of introducing the source material for yttrium-containing film formation into the deposition reactor, in which the substrate is located, through the vaporization of the source material, and then forming a precursor thin film on the substrate by depositing the source material for yttrium-containing film formation on a surface of the substrate; and a process of forming the yttrium-containing film including yttrium atoms on the surface of the substrate by reacting the precursor thin film with a reactive gas.

To introduce the source material for yttrium-containing film formation into the deposition reactor through the vaporization of the source material, the vapor transport method, the liquid transport method, the single source method, or the cocktail source method, which are described above, may be used.

The reactive gas is a gas for reacting with the precursor thin film. In an implementation, the reactive gas may include, e.g., an oxidizing gas, a reducing gas, or a nitrifying gas.

The oxidizing gas may include, e.g., $O_2$, $O_3$, $O_2$ plasma, $H_2O$, $NO_2$, NO, $N_2O$ (nitrous oxide), CO, $CO_2$, $H_2O_2$, HCOOH, $CH_3COOH$, $(CH_3CO)_2O$, alcohol, peroxide, sulfur oxide, or a combination thereof.

The reducing gas may include, e.g., a hydrocarbon compound such as methane or ethane, hydrogen, carbon monoxide, an organic metal compound, or a combination thereof.

The nitrifying gas may include, e.g., $NH_3$, $N_2$ plasma, an organic amine compound such as a monoalkylamine, a dialkylamine, a trialkylamine, or an alkylenediamine, a hydrazine compound, or a combination thereof.

In the process P20 of FIG. 1, when an yttrium oxide film is formed, the oxidizing gas may be used as the reactive gas. In the process P20 of FIG. 1, when an yttrium nitride film is formed, the nitrifying gas may be used as the reactive gas.

In an implementation, to form the yttrium-containing film including yttrium atoms in the process P20 of FIG. 1, a thermal CVD process where a thin film is formed by reacting a source gas, which includes the yttrium compound according to the embodiments, or the source gas and the reactive gas only by heat, a plasma CVD process using heat and plasma for the reaction, an optical CVD process using heat and light for the reaction, an optical plasma CVD process using heat, light, and plasma for the reaction, or an ALD process may be used.

In forming the yttrium-containing film according to the process P20 of FIG. 1, a reaction temperature (substrate temperature), a reaction pressure, a deposition rate, or the like may be appropriately selected according to the desired thickness and type of the yttrium-containing film. The reaction temperature may be selected from a range of room temperature to about 600° C., e.g., about 400° C. to about 550° C., which are sufficient for the reaction of the source material for yttrium-containing film formation.

In forming the yttrium-containing film according to the process P20 of FIG. 1, when an ALD process is used, the thickness of the yttrium-containing film may be adjusted by adjusting the number of cycles of the ALD process. When the yttrium-containing film is formed on the substrate by using an ALD process, the ALD process may include: a source material introduction process where a vapor formed by vaporizing the source material for yttrium-containing film formation, which includes the yttrium compound, is introduced into the deposition reactor; a precursor thin film formation process where a precursor thin film is formed on the surface of the substrate by using the vapor; an exhaust process where an unreacted source gas remaining in a reaction space over the substrate is discharged; and a process of forming the yttrium-containing film on the surface of the substrate by chemically reacting the precursor thin film with the reactive gas.

In an implementation, the process of vaporizing the source material for yttrium-containing film formation may be performed in the source material container or in the vaporization chamber. The process of vaporizing the source material for yttrium-containing film formation may be performed at about 0° C. to about 200° C. When the source material for yttrium-containing film formation is vaporized, a pressure in the source material container or the vaporization chamber may be, e.g., about 1 Pa to about 10,000 Pa.

Figure 2:
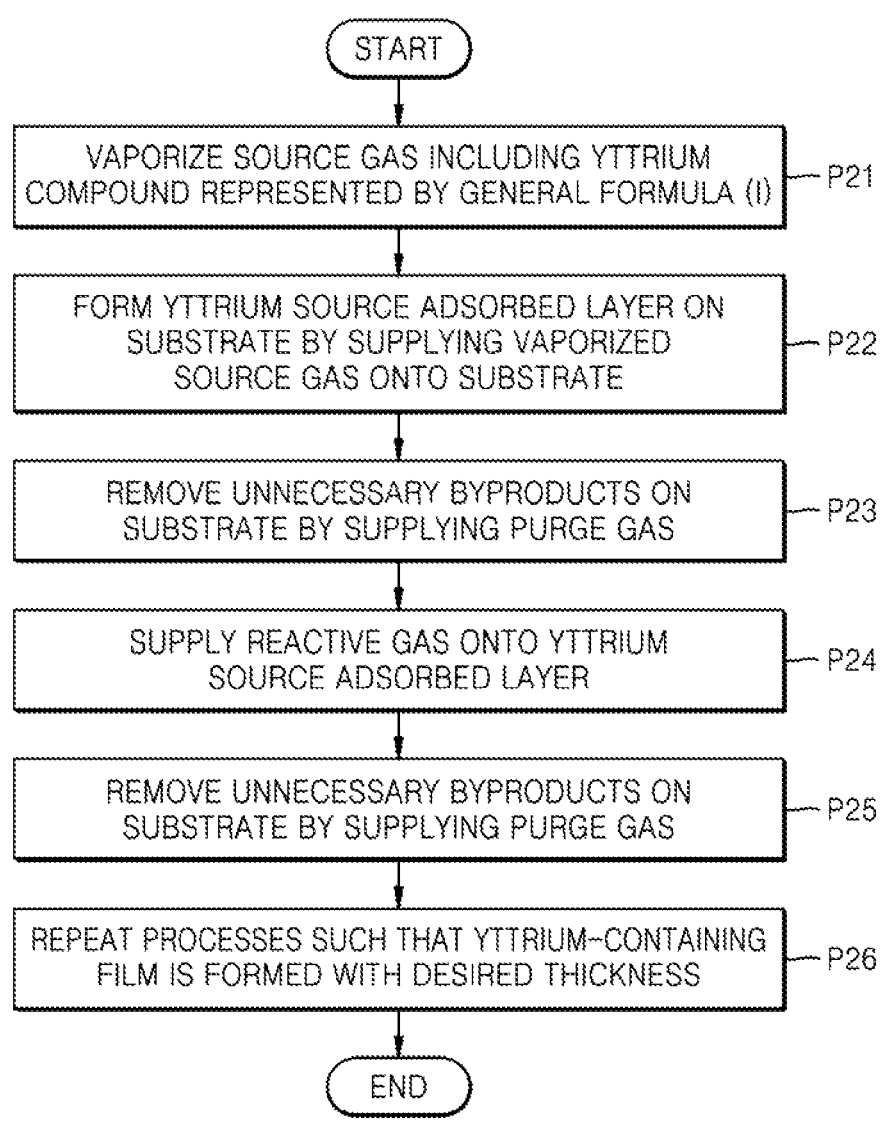
FIG. 2 is a flowchart of an example method of forming an yttrium-containing film in accordance with a method of manufacturing an integrated circuit device according to embodiments.

FIG. 2 is a flowchart of an example method of forming a yttrium-containing film in accordance with a method of manufacturing an integrated circuit device according to embodiments. The method of forming the yttrium-containing film by an ALD process according to the process P20 of FIG. 1 will be described with reference to FIG. 2.

Referring to FIG. 2, in a process P21, a source gas including an yttrium compound having a structure of General Formula (I) may be vaporized.

In an implementation, the source gas may include the above-described source material for yttrium-containing film formation. The process of vaporizing the source gas may be performed at, e.g., about 0° C. to about 200° C. When the source gas is vaporized, the pressure in the source material container or the vaporization chamber may be, e.g., about 1 Pa to about 10,000 Pa.

In a process P22, an yttrium source adsorbed layer including yttrium atoms may be formed on the substrate by supplying the source gas vaporized according to the process P21 onto the substrate. In an implementation, the reaction temperature may be selected from a range of room temperature to about 600° C., e.g., about 300° C. to about 550° C. The reaction pressure may be about 1 Pa to about 10,000 Pa, e.g., about 10 Pa to about 1,000 Pa.

The adsorbed layer including a chemisorbed layer or a physisorbed layer of the vaporized source gas may be formed on the substrate by supplying the vaporized source gas onto the substrate.

In a process P23, unnecessary byproducts on the substrate may be removed by supplying a purge gas onto the substrate.

The purge gas may include, e.g., an inert gas such as Ar, He, or Ne, $N_2$ gas, or the like.

In an implementation, exhaustion may be performed by decompressing the reaction space in which the substrate is located, rather than by the purge process. In an implementation, for the decompression, the pressure of the reaction space may be maintained at about 0.01 Pa to about 300 Pa, e.g., about 0.01 Pa to about 100 Pa.

In an implementation, a process of heating the substrate, on which the yttrium source adsorbed layer including yttrium atoms has been formed, or heat-treating the reaction chamber, in which the substrate is accommodated, may be further performed. The heat treatment may be performed at a temperature of room temperature to about 600° C., e.g., about 400° C. to about 550° C.

In a process P24, an yttrium-containing film may be formed in units of atomic layers by supplying a reactive gas onto the yttrium source adsorbed layer formed on the substrate.

In an implementation, when an yttrium oxide film is formed on the substrate, the reactive gas may be an oxidizing gas including, e.g., $O_2$, $O_3$, $O_2$ plasma, $H_2O$, $NO_2$, NO, $N_2O$ (nitrous oxide), CO, $CO_2$, $H_2O_2$, HCOOH, $CH_3COOH$, $(CH_3CO)_2O$, alcohol, peroxide, sulfur oxide, or a combination thereof.

During the process P24, the reaction space may be maintained at a temperature of room temperature to about 600° C., e.g., about 200° C. to about 500° C., such that the yttrium source adsorbed layer may sufficiently react with the reactive gas. During the process P24, the pressure of the reaction space may be about 1 Pa to about 10,000 Pa, e.g., about 10 Pa to about 1,000 Pa.

During the process P24, the reactive gas may be plasma-treated. A radio frequency (RF) output in the plasma treatment may be about 0 W to about 1,500 W, e.g., about 50 W to about 600 W.

In a process P25, unnecessary byproducts on the substrate may be removed by supplying a purge gas onto the substrate.

The purge gas may include, e.g., an inert gas such as Ar, He, or Ne, $N_2$ gas, or the like.

In a process P26, the processes P21 to P25 may be repeated such that the yttrium-containing film with a desired thickness is formed.

A thin film deposition process, which includes a series of processes including the processes P21 to P25, may be defined as one cycle, and the cycle may be repeated a plurality of times such that the yttrium-containing film with a desired thickness is formed. In an implementation, after the one cycle is performed, unreacted gases may be discharged from the reaction chamber by performing an exhaust process using a purge gas similarly as in the process P23 or the process P25, and then, a subsequent cycle may be performed.

In an implementation, to control the deposition rate of the yttrium-containing film, a source material supply condition (e.g., a vaporization temperature or a vaporization pressure of the source material), the reaction temperature, the reaction pressure, or the like may be controlled. If the deposition rate of the yttrium-containing film were to be too high, the obtained yttrium-containing film could have deteriorated properties. If the deposition rate of the yttrium-containing film were to be too low, the productivity could be deteriorated. In an implementation, the deposition rate of the yttrium-containing film may be about 0.01 nm/min to about 100 nm/min, e.g., about 0.1 nm/min to about 50 nm/min.

In an implementation, to form the yttrium-containing film on the substrate, the yttrium compound having the structure of General Formula (I), and at least one of the other precursor, the reactive gas, the carrier gas, and the purge gas may be supplied simultaneously or sequentially onto the substrate. More detailed configurations of the other precursor, the reactive gas, the carrier gas, and the purge gas, which may be supplied onto the substrate simultaneously with the yttrium compound having the structure of General Formula (I), are as described above.

In an implementation, in the process of forming the yttrium-containing film, which is described with reference to FIG. 2, the reactive gas may be supplied onto the substrate between each of the processes P21 to P25.

FIG. 3A to 3D are schematic diagrams of configurations of example deposition apparatuses 200A, 200B, 200C, and 200D, which may be used for the process of forming the yttrium-containing film in the method of manufacturing an integrated circuit device according to an embodiment.

Each of the deposition apparatuses 200A, 200B, 200C, and 200D shown in FIGS. 3A to 3D may include a fluid transfer unit 210, a thin film formation unit 250, in which a deposition process for forming a thin film on a substrate W by using a process gas supplied from a source material container 212 in the fluid transfer unit 210, and an exhaust system 270 for discharging gases, which may remain after use for reaction in the thin film formation unit 250, or reaction byproducts.

The thin film formation unit 250 may include a reaction chamber 254 including a susceptor 252 that supports the substrate W. A shower head 256 for supplying a gas, which is supplied from the fluid transfer unit 210, onto the substrate W is mounted in an upper end portion inside the reaction chamber 254.

The fluid transfer unit 210 may include an inflow line 222 for supplying the carrier gas to the source material container 212 from outside each deposition apparatus, and an outflow line 224 for supplying the source compound contained in the source material container 212 to the thin film formation unit 250. Valves V1 and V2 and mass flow controllers (MFCs) M1 and M2 may be respectively mounted on the inflow line 222 and the outflow line 224. The inflow line 222 and the outflow line 224 may be connected to each other via a bypass line 226. A valve V3 is mounted on the bypass line 226. The valve V3 may be pneumatically operated by an electric motor or other remotely controllable means.

The source compound supplied from the source material container 212 may be supplied into the reaction chamber 254 through an inflow line 266 of the thin film formation unit 250, which is connected to the outflow line 224 of the fluid transfer unit 210. The source compound supplied from the source material container 212, together with the carrier gas supplied through an inflow line 268, may be supplied into the reaction chamber 254, as needed. A valve V4 and an MFC M3 may be mounted on the inflow line 268 through which the carrier gas flows.

The thin film formation unit 250 may include an inflow line 262 for supplying the purge gas into the reaction chamber 254, and an inflow line 264 for supplying the reactive gas into the reaction chamber 254. Valves V5 and V6 and MFCs M4 and M5 may be respectively mounted on the inflow lines 262 and 264.

The used process gas and waste reaction byproducts in the reaction chamber 254 may be discharged to the outside of each deposition apparatus through the exhaust system 270. The exhaust system 270 may include an exhaust line 272 connected to the reaction chamber 254, and a vacuum pump 274 mounted on the exhaust line 272. The vacuum pump 274 may remove the process gas and the waste reaction byproducts, which are discharged from the reaction chamber 254.

A trap 276 may be mounted on the exhaust line 272 at the upstream side of the vacuum pump 274. The trap 276 may capture, e.g., the reaction byproducts generated by the process gas which has not completely reacted in the reaction chamber 254, and thus allow the reaction byproducts not to flow in the vacuum pump 274 at the downstream side of the trap 276.

The trap 276 mounted on the exhaust line 272 may capture extraneous matters, e.g., reaction byproducts generated by reaction between the process gases, and thus allow the extraneous matters not to flow toward the downstream side of the trap 276. The trap 276 may have a configuration capable of being cooled by a cooler or by water cooling.

In an implementation, a bypass line 278 and an automatic pressure controller 280 may be mounted on the exhaust line 272 at the upstream side of the trap 276. Valves V7 and V8 may be respectively mounted on the bypass line 278 and a portion of the exhaust line 272, which extends parallel to the bypass line 278.

Figure 3A:
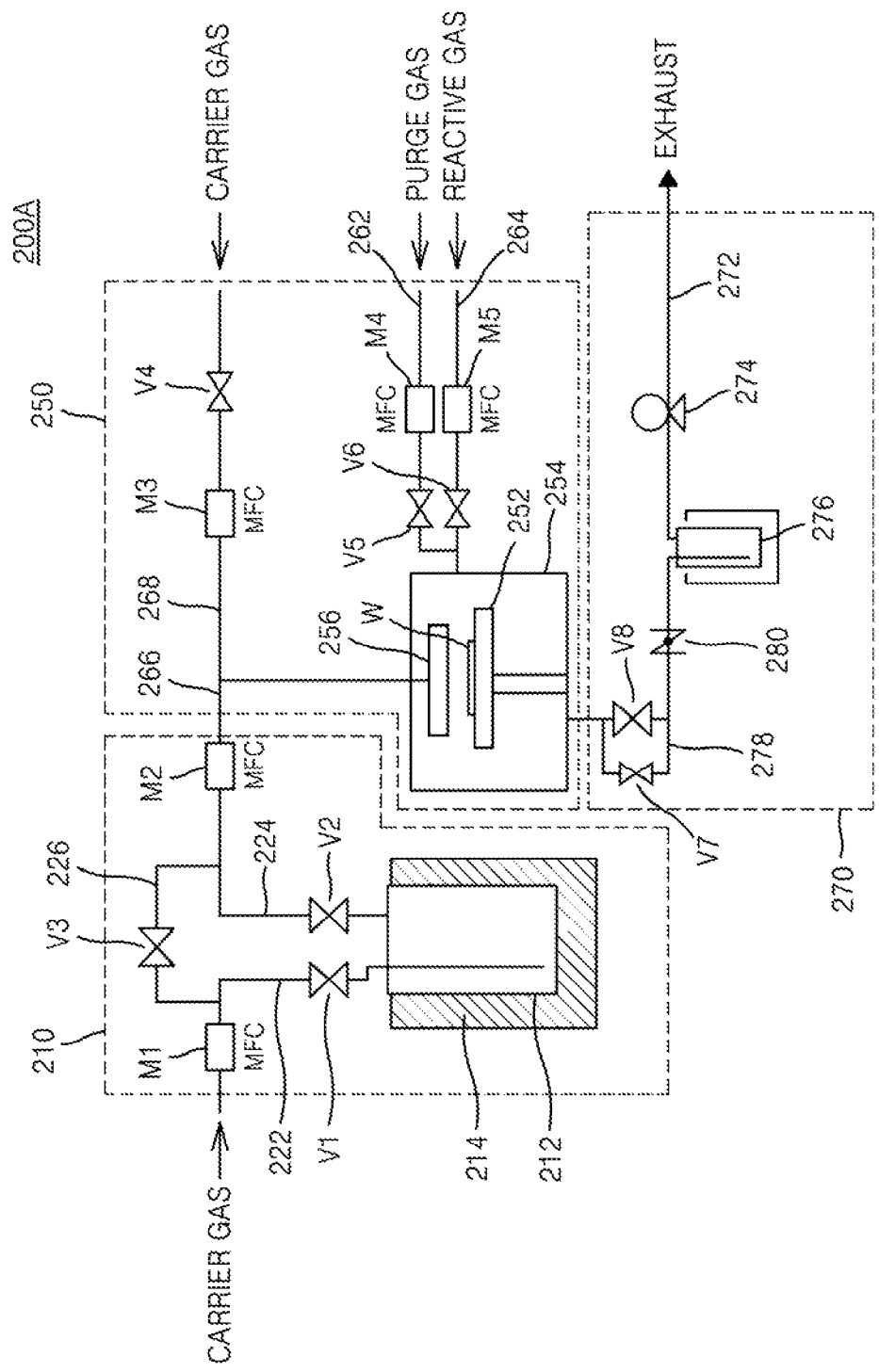
FIGS. 3A to 3D are schematic diagrams of an example configuration of a deposition apparatus, which may be used for a process of forming an yttrium-containing film in a method of manufacturing an integrated circuit device according to embodiments.
Figure 3B:
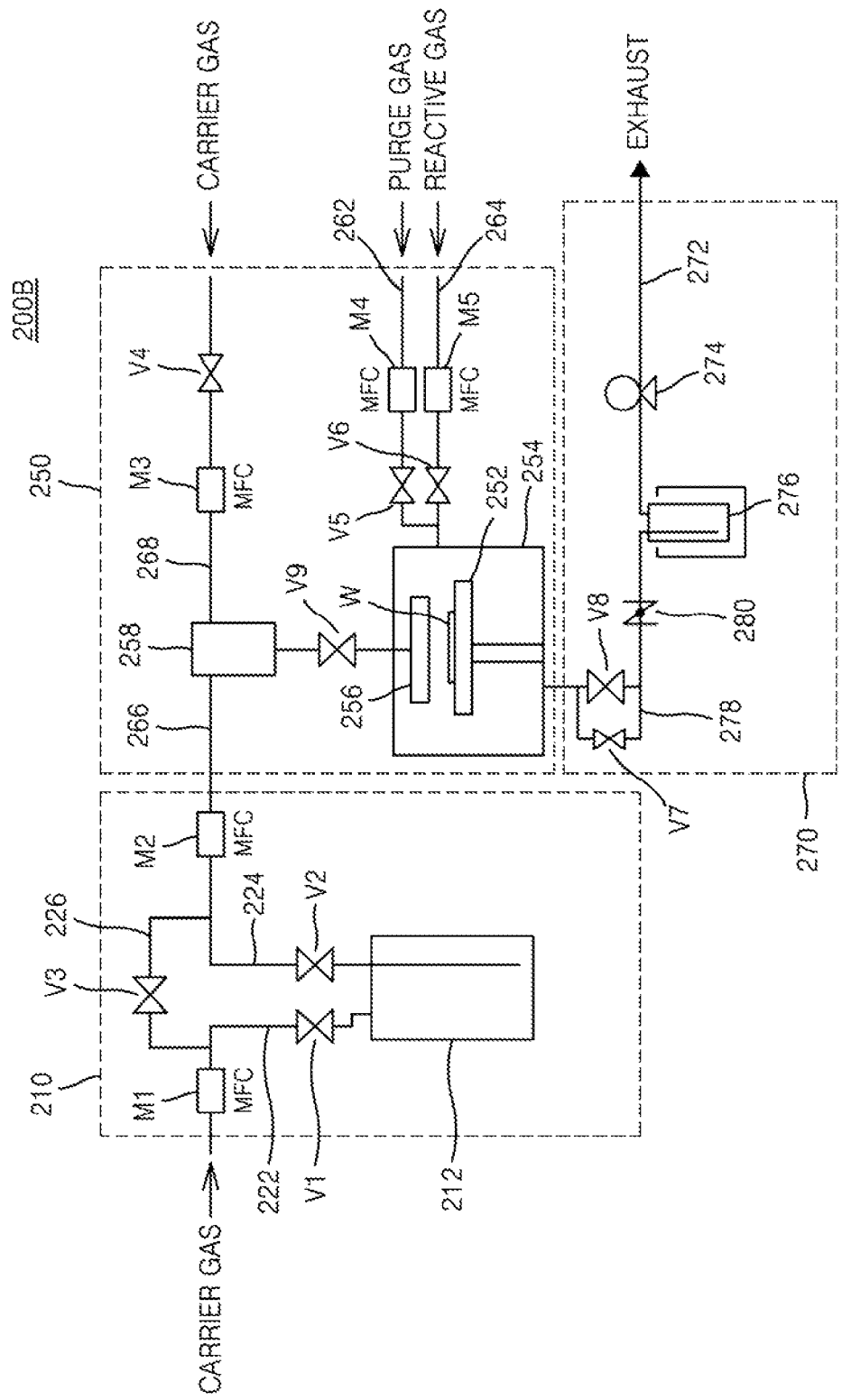
Figure 3C:
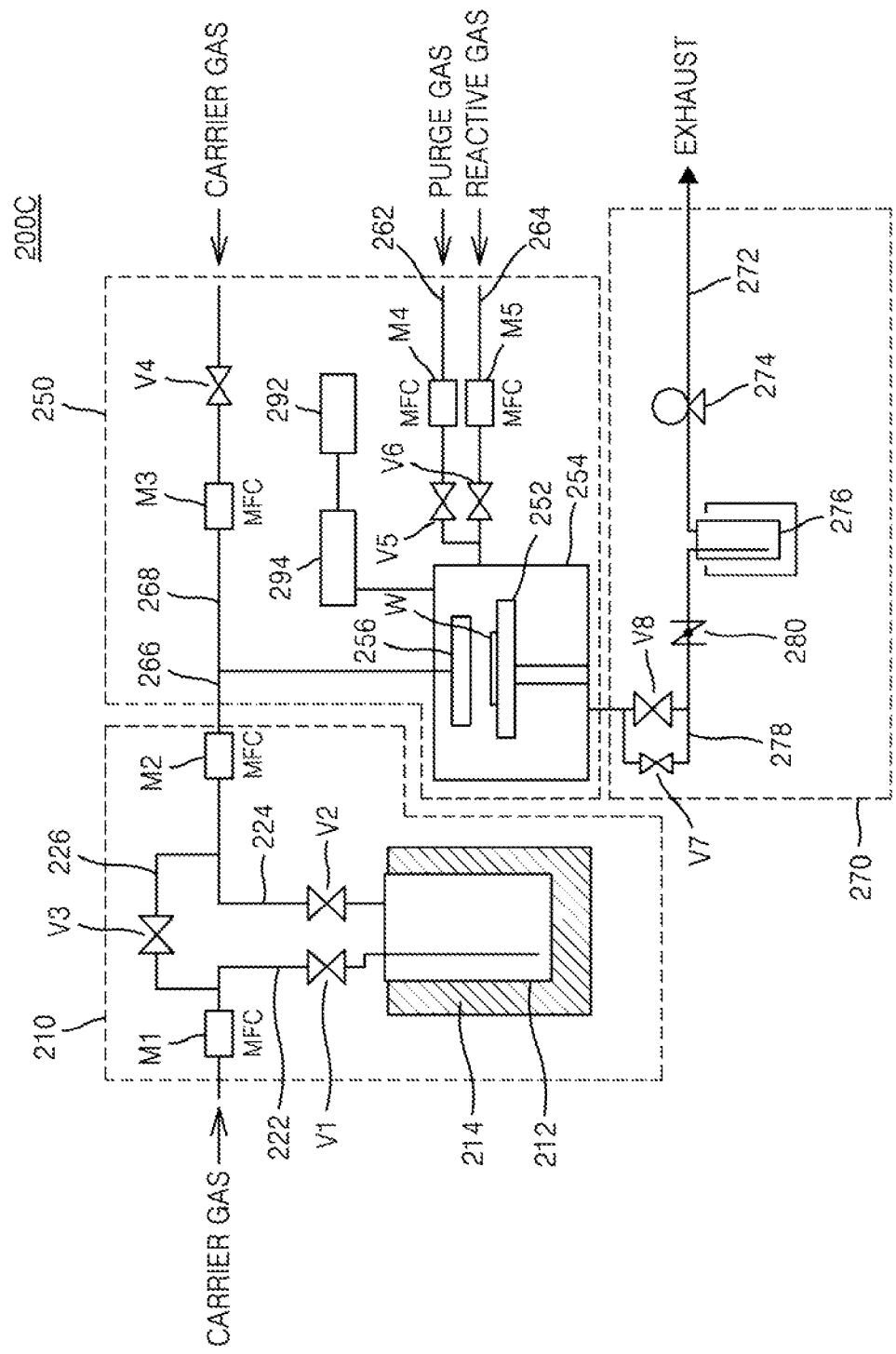

As in the deposition apparatuses 200A and 200C shown in FIGS. 3A and 3C, a heater 214 may be mounted on the source material container 212. The source compound accommodated in the source material container 212 may be maintained at a relatively high temperature by the heater 214.

Figure 3D:
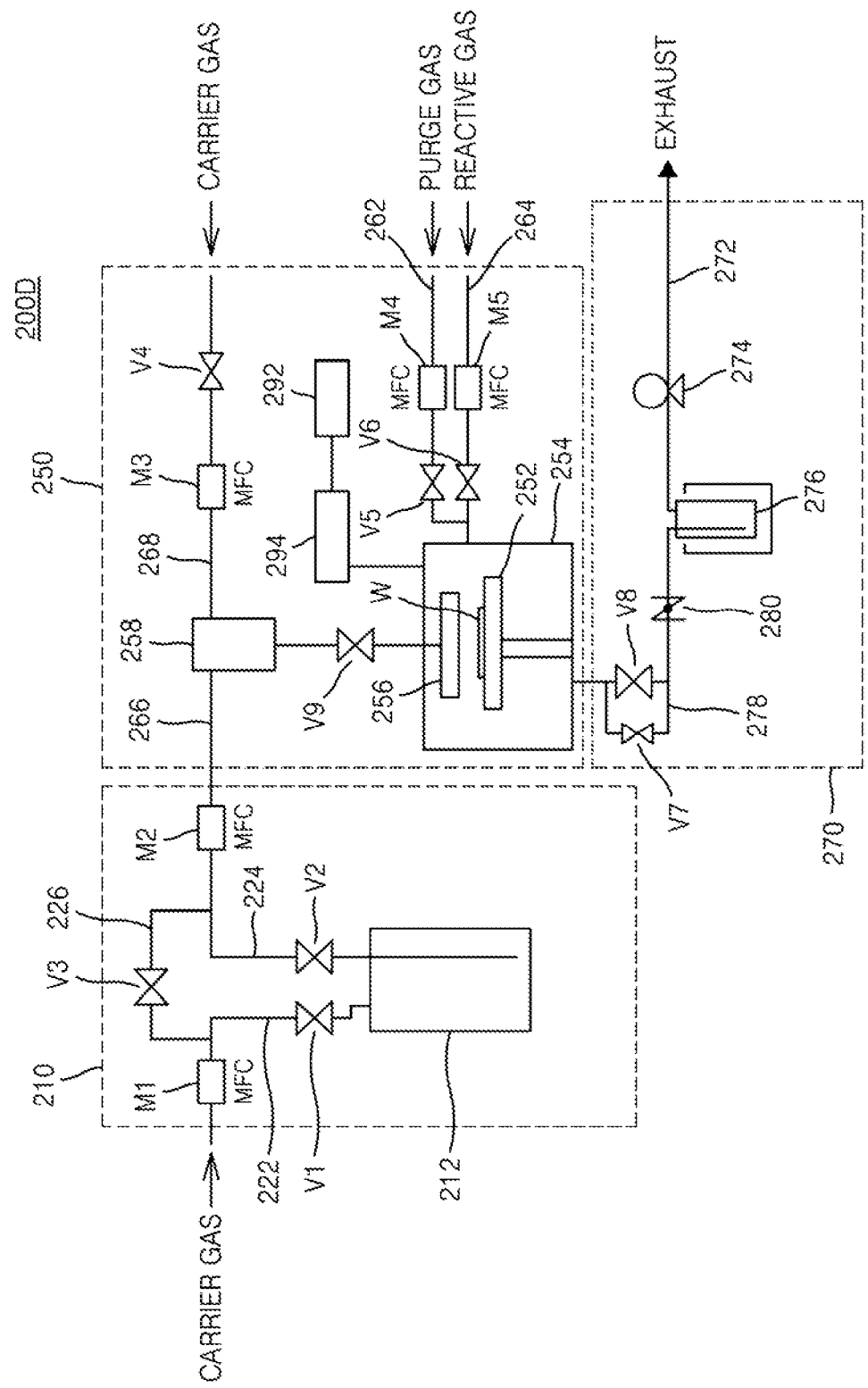

As in the deposition apparatuses 200B and 200D shown in FIGS. 3B and 3D, a vaporizer 258 may be mounted on the inflow line 266 of the thin film formation unit 250. The vaporizer 258 may vaporize a fluid supplied in a liquid state from the fluid transfer unit 210 and may supply the vaporized source compound into the reaction chamber 254. The source compound vaporized by the vaporizer 258, together with the carrier gas supplied through the inflow line 268, may be supplied into the reaction chamber 254. Inflow of the source compound, which is supplied to the reaction chamber 254 through the vaporizer 258, may be controlled by a valve V9.

In an implementation, as in the deposition apparatuses 200C and 200D shown in FIGS. 3C and 3D, to generate plasma inside the reaction chamber 254, the thin film formation unit 250 may include an RF power supply 292 and an RF matching system 294, which are connected to the reaction chamber 254.

In an implementation, as illustrated in the drawings, one source material container 212 may be connected to the reaction chamber 254. In an implementation, the fluid transfer unit 210 may include a plurality of source material containers 212, as needed, and each of the plurality of source material containers 212 may be connected to the reaction chamber 254.

To vaporize the source material for yttrium-containing film formation, which includes the yttrium compound represented by General Formula (I), the vaporizer 258 may be used in one of the deposition apparatuses 200B and 200D shown in FIGS. 3B and 3D.

To form the yttrium-containing film on the substrate in accordance with the method of manufacturing an integrated circuit device, which has been described with reference to FIGS. 1 and 2, one of the deposition apparatuses 200A, 200B, 200C, and 200D shown in FIGS. 3A to 3D may be used. To this end, the yttrium compound according to the embodiments, which has the structure of General Formula (I), may be transported by suitable methods and supplied into a reaction space of a thin film formation apparatus, e.g., the reaction chamber 254 of the deposition apparatuses 200A, 200B, 200C, and 200D shown in FIGS. 3A to 3D.

In an implementation, to form the yttrium-containing film in accordance with the method described with reference to FIGS. 1 and 2, the yttrium-containing film may be simultaneously formed on a plurality of substrates by using batch-type equipment instead of single-type equipment such as the deposition apparatuses 200A, 200B, 200C, and 200D shown in FIGS. 3A to 3D.

In forming the yttrium-containing film in accordance with the method of manufacturing an integrated circuit device according to the embodiments, conditions for forming the yttrium-containing film may include a reaction temperature (substrate temperature), a reaction pressure, a deposition rate, or the like.

The reaction temperature may be selected from a temperature range allowing the yttrium compound, e.g., the yttrium compound having the structure of General Formula (I), to be sufficiently reacted, e.g., a temperature range of about 150° C. or higher, a temperature range of about 150° C. to about 600° C., or a temperature range of about 300° C. to about 550° C.

In an implementation, the reaction pressure may be selected from a range of about 10 Pa to atmospheric pressure in the case of a thermal CVD process or an optical CVD process, or a range of about 10 Pa to about 2000 Pa in the case of using plasma.

In an implementation, the deposition rate may be controlled by adjusting conditions for supplying the source compound (e.g., a vaporization temperature and a vaporization pressure), the reaction temperature, and the reaction pressure. In the thin film formation method according to the embodiments, the deposition rate of the yttrium-containing film may be selected from a range of about 0.01 nm/min to about 100 nm/min, e.g., about 0.1 nm/min to about 50 nm/min. When the yttrium-containing film is formed by an ALD process, the number of ALD cycles may be adjusted to control the yttrium-containing film to a desired thickness.

In an implementation, when the yttrium-containing film is formed by an ALD process, energy such as plasma, light, or voltage may be applied. A time point of applying the energy may be variously selected. In an implementation, at a time point when a source gas including the yttrium compound is introduced into the reaction chamber, at a time point when the source gas is adsorbed onto the substrate, at a time point of an exhaust process by the purge gas, at a time point when the reactive gas is introduced into the reaction chamber, or between each of these time points, the energy such as plasma, light, or voltage may be applied.

In an implementation, after the yttrium-containing film is formed by using the yttrium compound having the structure of General Formula (I), the thin film formation method may further include a process of performing annealing under, e.g., an inert atmosphere, an oxidizing atmosphere, or a reducing atmosphere. In an implementation, to planarize steps formed at a surface of the yttrium-containing film, a reflow process may be performed on the yttrium-containing film, as needed. Each of the annealing process and the reflow process may be performed at a temperature selected from a range of about 200° C. to about 1,000° C., e.g., about 250° C. to about 500° C.

In an implementation, by appropriately selecting the yttrium compound according to the embodiments, the other precursor used together with the yttrium compound, the reactive gas, and the process conditions for thin film formation, various yttrium-containing films may be formed. In an implementation, the yttrium-containing film formed according to the embodiments may be an yttrium oxide film or an yttrium-containing composite oxide film. The yttrium-containing film formed according to the embodiment may be used as materials of various components constituting an integrated circuit device. In an implementation, the yttrium-containing film formed according to the embodiments may be used for an electrode material of a dynamic random access memory (DRAM) device, a gate of a transistor, a resistor, a diamagnetic film used for a hard disk recording layer, a catalyst material for solid polymer fuel cells, a conductive barrier film used for metal wiring lines, a dielectric film of a capacitor, a barrier metal film for liquid crystals, a member for thin-film solar cells, a member for semiconductor equipment, a nano-structure, or the like.

Figure 4A:
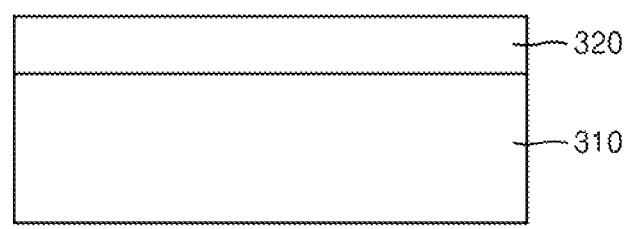
FIGS. 4A and 4B are cross-sectional views of stages in a method of manufacturing an integrated circuit device according to embodiments.
Figure 4B:
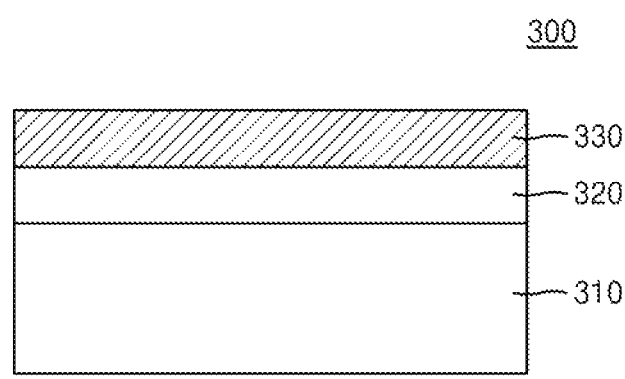

FIGS. 4A and 4B are cross-sectional views of stages in a method of manufacturing an integrated circuit device 300 (see FIG. 4B), according to embodiments.

Referring to FIG. 4A, a lower structure 320 may be formed on a substrate 310.

The substrate 310 may include a semiconductor such as Si or Ge, or a compound semiconductor such as SiGe, SiC, GaAs, InAs, or InP. The substrate 310 may include a conductive region, e.g., an impurity-doped well or an impurity-doped structure.

In an implementation, the lower structure 320 may include a conductive film. In an implementation, the lower structure 320 may include a doped semiconductor, a conductive metal nitride, a metal, a metal silicide, a conductive oxide, or a combination thereof. In an implementation, the lower structure 320 may include NbN, TiN, TiAlN, TaN, TaAlN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCo (($La,Sr)CoO_3$), or a combination thereof. To form the lower structure 320, a CVD, metal organic CVD (MOCVD), or ALD process may be used.

In an implementation, the lower structure 320 may include an insulating film. In an implementation, the lower structure 320 may include, e.g., an oxide film such as borophosphosilicate glass (BPSG), phosphosilicate glass (PSG), or undoped silicate glass (USG), an $SiO_2$ film, a silicon nitride film, a silicon carbonitride film, a silicon oxycarbonitride film, a tantalum oxide film, a titanium oxide film, or a combination thereof.

In an implementation, the lower structure 320 may include a dielectric film. In an implementation, the lower structure 320 may include, e.g., hafnium oxide, hafnium oxynitride, hafnium silicon oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

Referring to FIG. 4B, an yttrium-containing film 330 may be formed on the lower structure 320. The yttrium-containing film 330 may be formed to be in contact with the lower structure 320.

To form the yttrium-containing film 330, the yttrium compound represented by General Formula (I) may be used. In an implementation, to form the yttrium-containing film 330, the processes described with reference to FIG. 1 or 2 may be performed.

In the method of manufacturing the integrated circuit device 300, which is described with reference to FIGS. 4A and 4B, the lower structure 320 may have a 3-dimensional structure having a relatively high aspect ratio. To form the yttrium-containing film 330 with high quality in a deep and narrow 3-dimensional space in the lower structure 320, an ALD process may be used. In accordance with the method of manufacturing an integrated circuit device, as described with reference to FIGS. 4A and 4B, according to embodiments, the yttrium compound represented by General Formula (I) may be used in forming the yttrium-containing film 330, thereby improving process stability.

Next, specific examples of synthesizing the yttrium compound according to embodiments, and methods of forming an yttrium-containing film will be described.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of Compound Represented by Formula 13

9.10 g ($3.20 \times 10^{-2}$ mol) of Y(Cp)$_3$ and 100 mL of hexane were introduced into a 300 mL flask, in which a substitution with an Ar atmosphere was made, followed by cooling the flask to 0° C. 4.55 g ($3.20 \times 10^{-2}$ mol) of (E)-N'-(sec-butyl)-N-isopropylformimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 165° C. at a vacuum level of 30 Pa, thereby obtaining 7.7 g of the compound represented by Formula 13. (Yield 67%)
(Analysis)
(1) Elemental analysis (metal analysis: ICP-AES)
C: 59.97, H: 7.56, N: 7.80, Y: 24.66
(theoretical value: C: 60.00, H: 7.55, N: 7.77, Y: 24.67)
(2) Analysis results by 1H-NMR (heavy benzene)
7.46 ppm (1H, singlet), 6.16 ppm (10H, singlet), 3.00 ppm (1H, multiplet), 2.64 ppm (1H, multiplet) 1.23 ppm (2H, multiplet), 0.97 ppm (6H, doublet), 0.96 ppm (3H, doublet), 0.95 ppm (3H, triplet)
(3) Atmospheric pressure thermogravimetry-differential thermal analysis (TG-DTA) mass 50% reduction temperature: 239° C. (760 torr, Ar flow rate: 100 ml/min, heating rate: 10° C./min)

Synthesis Example 2

Synthesis of Compound Represented by Formula 14

9.10 g ($3.20 \times 10^{-2}$ mol) of Y(Cp)$_3$ and 100 mL of hexane were introduced into a 300 mL flask, in which a substitution with an Ar atmosphere was made, followed by cooling the flask to 0° C. 5.00 g ($3.20 \times 10^{-2}$ mol) of (E)-N'-(sec-butyl)-N-isopropylacetimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 185° C. at a vacuum level of 30 Pa, thereby obtaining 7.8 g of the compound represented by Formula 14. (Yield 65%)
(Analysis)
(1) Elemental analysis (metal analysis: ICP-AES)
C: 60.90, H: 7.92, N: 7.37, Y: 23.81
(theoretical value: C: 60.96, H: 7.81, N: 7.48, Y: 23.75)
(2) Analysis results by 1H-NMR (heavy benzene)
6.20 ppm (10H, doublet), 3.24 ppm (1H, multiplet), 3.01 ppm (1H, multiplet), 1.44 ppm (3H, singlet), 1.28 ppm (1H, multiplet), 1.17 ppm (1H, multiplet), 0.94 ppm (3H, doublet), 0.92 ppm (3H, doublet), 0.90 ppm (3H, doublet), 0.80 ppm (3H, triplet)
(3) Atmospheric pressure TG-DTA mass 50% reduction temperature: 256° C. (760 torr, Ar flow rate: 100 ml/min, heating rate: 10° C./min)

Synthesis Example 3

Synthesis of Compound Represented by Formula 16

10.5 g ($3.20 \times 10^{-2}$ mol) of Y(MeCp)$_3$ and 100 mL of hexane were introduced into a 300 mL flask, in which a substitution with an Ar atmosphere was made, followed by cooling the flask to 0° C. 4.55 g ($3.20 \times 10^{-2}$ mol) of (E)-N'-(sec-butyl)-N-isopropylformimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 168° C. at a vacuum level of 30 Pa, thereby obtaining 7.7 g of the compound represented by Formula 16. (Yield 62%)
(Analysis)
(1) Elemental analysis (metal analysis: ICP-AES)
C: 61.85, H: 8.00, N: 7.23, Y: 22.92
(theoretical value: C: 61.85, H: 8.05, N: 7.21, Y: 22.89)
(2) Analysis results by 1H-NMR (heavy benzene)
7.59 ppm (1H, singlet), 6.07 ppm (8H, doublet), 3.05 ppm (1H, multiplet), 2.72 ppm (1H, multiplet), 2.12 ppm (6H, doublet), 1.28 ppm (2H, multiplet), 0.99 ppm (6H, doublet), 0.97 ppm (3H, doublet), 0.81 ppm (3H, triplet)
(3) Atmospheric pressure TG-DTA mass 50% reduction temperature: 249° C. (760 torr, Ar flow rate: 100 ml/min, heating rate: 10° C./min)

Synthesis Example 4

Synthesis of Compound Represented by Formula 17

10.5 g ($3.20 \times 10^{-2}$ mol) of Y(MeCp)$_3$ and 100 mL of hexane were introduced into a 300 mL flask, in which a substitution with an Ar atmosphere was made, followed by cooling the flask to 0° C. 5.00 g ($3.20 \times 10^{-2}$ mol) of (E)-N'-(sec-butyl)-N-isopropylacetimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 171° C. at a vacuum level of 30 Pa, thereby obtaining 7.9 g of the compound represented by Formula 17. (Yield 61%)
(Analysis)
- (1) Elemental analysis (metal analysis: ICP-AES)
  C: 62.74, H: 8.11, N: 6.90, Y: 22.25
  (theoretical value: C: 62.68, H: 8.27, N: 6.96, Y: 22.09)
- (2) Analysis results by 1H-NMR (heavy benzene)
  6.09 ppm (4H, multiplet), 5.98 ppm (4H, multiplet), 3.30 ppm (1H, multiplet), 3.02 ppm (1H, multiplet), 2.14 ppm (6H, doublet), 1.50 ppm (3H, singlet), 1.37 ppm (1H, multiplet), 1.16 ppm (1H, multiplet), 0.96 ppm (3H, doublet), 0.94 ppm (3H, doublet), 0.92 ppm (3H, doublet), 0.81 ppm (3H, triplet)
- (3) Atmospheric pressure TG-DTA mass 50% reduction temperature: 264° C. (760 torr, Ar flow rate: 100 ml/min, heating rate: 10° C./min)

Synthesis Example 5

Synthesis of Compound Represented by Formula 20

11.8 g ($3.20 \times 10^{-2}$ mol) of Y(EtCp)$_3$ and 100 mL of hexane were introduced into a 300 mL flask, in which a substitution with an Ar atmosphere was made, followed by cooling the flask to 0° C. 5.00 g ($3.20 \times 10^{-2}$ mol) of (E)-N'-(sec-butyl)-N-isopropylacetimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 162° C. at a vacuum level of 30 Pa, thereby obtaining 8.5 g of the compound represented by Formula 20. (Yield 62%)
(Analysis)
- (1) Elemental analysis (metal analysis: ICP-AES)
  C: 64.17, H: 8.63, N: 6.50, Y: 20.69
  (theoretical value: C: 64.17, H: 8.66, N: 6.51, Y: 20.65)
- (2) Analysis results by 1H-NMR (heavy benzene)
  6.09 ppm (8H, multiplet), 3.30 ppm (1H, multiplet), 3.03 ppm (1H, multiplet), 2.54 ppm (4H, multiplet), 1.50 ppm (3H, singlet), 1.36 ppm (1H, multiplet), 1.21 ppm (6H, multiplet), 1.17 ppm (1H, multiplet), 0.98 ppm (3H, doublet), 0.96 ppm (3H, doublet), 0.94 ppm (3H, doublet), 0.82 ppm (3H, triplet)
- (3) Atmospheric pressure TG-DTA mass 50% reduction temperature: 270° C. (760 torr, Ar flow rate: 100 ml/min, heating rate: 10° C./min)

Synthesis Example 6

Synthesis of Compound Represented by Formula 100

10.5 g ($3.20 \times 10^{-2}$ mol) of Y(MeCp)$_3$ and 100 mL of hexane were introduced into a 300 mL flask, in which a substitution with an Ar atmosphere was made, followed by cooling the flask to 0° C. 4.10 g ($3.20 \times 10^{-2}$ mol) of (E)-N'-(sec-butyl)-N-ethylformimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 168° C. at a vacuum level of 30 Pa, thereby obtaining 8.1 g of the compound represented by Formula 100. (Yield 68%)
(Analysis)
- (1) Elemental analysis (metal analysis: ICP-AES)
  C: 60.94, H: 7.82, N: 7.50, Y: 23.74
  (theoretical value: C: 60.96, H: 7.81, N: 7.48, Y: 23.75)
- (2) Analysis results by 1H-NMR (heavy benzene)
  7.50 ppm (1H, singlet), 6.04 ppm (8H, multiplet), 2.93 ppm (2H, quartet), 2.72 ppm (1H, multiplet), 2.08 ppm (6H, singlet), 1.25 ppm (2H, multiplet), 0.99 ppm (3H, triplet), 0.97 ppm (3H, doublet), 0.83 ppm (3H, triplet)
- (3) Atmospheric pressure TG-DTA mass 50% reduction temperature: 246° C. (760 torr, Ar flow rate: 100 ml/min, heating rate: 10° C./min)

Synthesis Example 7

Synthesis of Compound Represented by Formula 109

9.10 g ($3.20 \times 10^{-2}$ mol) of Y(Cp)$_3$ and 100 mL of hexane were introduced into a 300 mL flask, in which a substitution with an Ar atmosphere was made, followed by cooling the flask to 0° C. 4.55 g ($3.20 \times 10^{-2}$ mol) of (E)-N'-(sec-butyl)-N-propylformimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 165° C. at a vacuum level of 30 Pa, thereby obtaining 7.5 g of the compound represented by Formula 109. (Yield 65%)
(Analysis)
- (1) Elemental analysis (metal analysis: ICP-AES)
  C: 60.04, H: 7.50, N: 7.78, Y: 24.67
  (theoretical value: C: 60.00, H: 7.55, N: 7.77, Y: 24.67)
- (2) Analysis results by 1H-NMR (heavy benzene)
  7.41 ppm (1H, singlet), 6.15 ppm (10H, singlet), 2.90 ppm (2H, triplet) 2.70 ppm (1H, multiplet), 1.35 ppm (2H, multiplet), 1.26 ppm (2H, multiplet), 0.98 ppm (3H, doublet), 0.85 ppm (3H, triplet), 0.82 ppm (3H, triplet)
- (3) Atmospheric pressure TG-DTA mass 50% reduction temperature: 245° C. (760 torr, Ar flow rate: 100 ml/min, heating rate: 10° C./min)

Synthesis Example 8

Synthesis of Compound Represented by Formula 127

11.8 g ($3.20 \times 10^{-2}$ mol) of Y(1,3-Me$_2$Cp)$_3$ and 100 mL of hexane were introduced into a 300 mL flask, in which a substitution with an Ar atmosphere was made, followed by cooling the flask to 0° C. 4.55 g ($3.20 \times 10^{-2}$ mol) of (E)-N'-(sec-butyl)-N-isopropylformimidamide was slowly added to the flask, followed by heating the flask to room temperature and then stirring for 12 hours. An obtained resulting product underwent solvent removal at an oil bath temperature of 80° C. under reduced pressure, followed by performing purification by distillation at an oil bath temperature of 170° C. at a vacuum level of 30 Pa, thereby obtaining 8.1 g of the compound represented by Formula 127. (Yield 61%)

(Analysis)
(1) Elemental analysis (metal analysis: ICP-AES)
C: 63.44, H: 8.50, N: 6.76, Y: 21.30
(theoretical value: C: 63.45, H: 8.47, N: 6.73, Y: 21.35)
(2) Analysis results by 1H-NMR (heavy benzene)
7.67 ppm (1H, doublet), 5.87 ppm (6H, multiplet), 3.10 ppm (1H, multiplet), 2.77 ppm (1H, multiplet), 2.12 ppm (12H, triplet) 1.31 ppm (2H, multiplet), 1.02 ppm (6H, doublet), 1.00 ppm (3H, doublet), 0.83 ppm (3H, triplet)
(3) Atmospheric pressure TG-DTA mass 50% reduction temperature: 260° C. (760 torr, Ar flow rate: 100 ml/min, heating rate: 10° C./min)

Evaluation Examples and Comparative Evaluation Examples of Compounds

The compounds of Formulae 13, 14, 16, 17, 20, 100, 109, and 127, which were obtained in Synthesis Examples 1 to 8, and Comparison Compounds 1 and 2, shown below, were evaluated as to states thereof at 20° C., melting points thereof, and thermal stability, and results thereof are shown in Table 1.

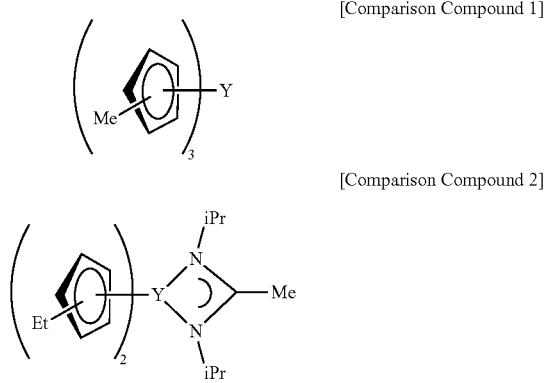

[Comparison Compound 1]

[Comparison Compound 2]

(1) Evaluation of Melting Point
The state of each compound at 20° C. was observed by the naked eye. Each compound that is a solid at 20° C. was measured as to a melting point thereof by using melting point measuring equipment. A compound having a relatively low melting point may be suitable as a source material for thin film formation due to the facilitation of the supply thereof (2) Thermal Stability
An initial decomposition temperature (T1) was measured by using a differential scanning calorimeter (DSC). A compound having a relatively high initial decomposition temperature may not easily be decomposed by heat, and thus may be suitable as a source material for thin film formation.

TABLE 1

| | Compound | State at 20° C. | Melting point | T1 (° C.) |
|---|---|---|---|---|
| Evaluation Example 1 | Formula 13 | Solid | 29 | 455 |
| Evaluation Example 2 | Formula 14 | Solid | 34 | 430 |
| Evaluation Example 3 | Formula 16 | Liquid | — | 445 |
| Evaluation Example 4 | Formula 17 | Liquid | — | 435 |
| Evaluation Example 5 | Formula 20 | Liquid | — | 440 |
| Evaluation Example 6 | Formula 100 | Liquid | — | 425 |
| Evaluation Example 7 | Formula 109 | Liquid | — | 425 |

TABLE 1-continued

| | Compound | State at 20° C. | Melting point | T1 (° C.) |
|---|---|---|---|---|
| Evaluation Example 8 | Formula 127 | Liquid | — | 460 |
| Comparative Evaluation Example 1 | Comparison Compound 1 | Solid | 124 | 400 |
| Comparative Evaluation Example 2 | Comparison Compound 2 | Liquid | — | 405 |

From the results of Table 1, it may be seen that the compounds of Formulae 13, 14, 16, 17, 20, 100, 109, and 127, which are yttrium compounds represented by General Formula (I), had lower melting points than Comparison Compound 1. In addition, it may be seen that the compounds of Formulae 16, 17, 20, 100, 109, and 127 were liquids at 20° C.

It may be seen that the compounds of Formulae 13, 14, 16, 17, 20, 100, 109, and 127 had higher initial decomposition temperatures than Comparison Compounds 1 and 2, by as much as 20° C. or more. It may be seen that the compounds of Formulae 13, 16 and 127 had significantly higher initial decomposition temperatures than the other compounds.

Evaluation Examples of Thin-Film Formation

By using each of the compounds of Formulae 13, 14, 16, 17, 20, 100, 109, and 127, which were obtained in Synthesis Examples 1 to 8, and Comparison Compounds 1 and 2, as a source material and using the deposition apparatus of FIG. 3A, an yttrium-containing film was formed on a silicon substrate by an ALD process. ALD process conditions for forming the yttrium-containing film were as follows.

(Conditions)
Reaction temperature (Substrate temperature): 350° C.
Reactive gas: $O_3$
(Processes)
Under the above-described conditions, by defining the following series of processes (1) to (4) as one cycle, 50 cycles were repeated.

Process (1): A process of introducing a source material, which is vaporized at a source material container heating temperature of 150° C. and a source material container internal-pressure of 100 Pa, into a chamber and depositing the source material at an internal chamber pressure of 100 Pa for 20 seconds.

Process (2): A process of removing the unreacted source material by Ar purge for 15 seconds.

Process (3): A process of supplying the reactive gas and performing reaction at a chamber pressure of 100 Pa for 0.4 seconds.

Process (4): A process of removing the unreacted source material by Ar purge for 90 seconds.

Each of the thin films obtained through the above-described processes was measured regarding the thickness thereof by X-ray reflectivity, was identified regarding the compound thereof by X-ray diffraction, and was measured regarding the amount of carbon therein by X-ray photoelectron spectroscopy, and results thereof are shown in Table 2.

TABLE 2

| | Compound | Thickness of thin film | Compound of thin film | Amount of carbon |
|---|---|---|---|---|
| Evaluation Example 9 | Formula 13 | 6.5 nm | Yttrium oxide | Not detected |
| Evaluation Example 10 | Formula 14 | 4.0 nm | Yttrium oxide | Not detected |
| Evaluation Example 11 | Formula 16 | 6.0 nm | Yttrium oxide | Not detected |
| Evaluation Example 12 | Formula 17 | 4.5 nm | Yttrium oxide | Not detected |
| Evaluation Example 13 | Formula 20 | 5.0 nm | Yttrium oxide | Not detected |
| Evaluation Example 14 | Formula 100 | 7.0 nm | Yttrium oxide | Not detected |
| Evaluation Example 15 | Formula 109 | 5.5 nm | Yttrium oxide | Not detected |
| Evaluation Example 16 | Formula 127 | 5.5 nm | Yttrium oxide | Not detected |
| Comparative Evaluation Example 3 | Comparison Compound 1 | 2.0 nm | Yttrium oxide | 8 atom % |
| Comparative Evaluation Example 4 | Comparison Compound 2 | 2.5 nm | Yttrium oxide | 6 atom % |

In Table 2, the limit in detection of the amount of carbon was 0.1 atom %. In the results of Table 2, among yttrium oxide thin films obtained by the ALD method, each of the yttrium oxide thin films obtained from Comparison Compounds 1 and 2 included carbon in an amount of 6 atom % or more. On the other hand, it may be seen that the yttrium oxide thin films obtained from the compounds of Formulae 13, 14, 16, 17, 20, 100, 109, and 127, which were obtained in Synthesis Examples 1 to 8, included carbon in an amount of 0.1 atom % or less, which was the detection limit, and thus had high quality. In addition, as a result of evaluating the thicknesses of the yttrium oxide thin films obtained after performing 50 cycles of the ALD process, it may be seen that, the yttrium oxide thin films obtained from Comparison Compounds 1 and 2 had thicknesses of 2.5 nm or less, and the yttrium oxide thin films obtained from the compounds of Formulae 13, 14, 16, 17, 20, 100, 109, and 127, which were obtained in Synthesis Examples 1 to 8, had thicknesses of 4.0 nm or more and thus provided excellent productivity in the thin-film formation process.

As may be seen from the above-described Evaluation Examples, the yttrium compounds according to an embodiment may have relatively low melting points and relatively high vapor pressures and may help improve the productivity of thin film formation when used as a source material for thin film formation by an ALD or CVD process.

By way of summation and review, a source compound may be used for yttrium-containing film formation, may be capable of providing excellent filling properties and excellent step coverage in forming yttrium-containing films to manufacture integrated circuit devices, and may have an advantage in process stability and mass-productivity due to easy handling thereof.

One or more embodiments may provide an yttrium compound including an amidinate.

One or more embodiments may provide an yttrium compound having properties suitable to be used as a source compound for forming an yttrium-containing film.

One or more embodiments may provide a method of manufacturing an integrated circuit device, which may provide desired electrical properties by forming an yttrium-containing film with excellent quality by using an yttrium compound capable of providing excellent process stability and mass-productivity.

Example embodiments have been disclosed herein, and although specific terms are employed, they are used and are to be interpreted in a generic and descriptive sense only and not for purpose of limitation. In some instances, as would be apparent to one of ordinary skill in the art of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising forming an yttrium-containing film on a substrate by using an yttrium compound represented by General Formula (I),

[General Formula (I)]

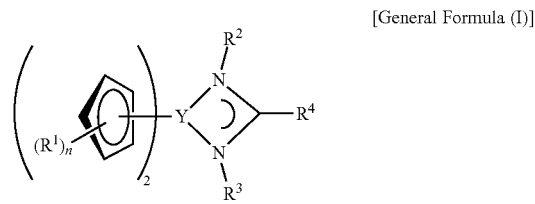

wherein, in
R$^1$ is a C$_1$-C$_5$ linear or branched alkyl group,
R$^2$ and R$^3$ are each a C$_1$-C$_8$ linear or branched alkyl group, R$^2$ having a structure different than that of R$^3$,
R$^4$ is a hydrogen atom or a C$_1$-C$_5$ linear or branched alkyl group, and
n is an integer of 0 to 5.

2. The method as claimed in claim 1, wherein forming the yttrium-containing film includes:
vaporizing the yttrium compound represented by General Formula (I);
forming an yttrium source adsorption layer on the substrate by supplying the vaporized yttrium compound onto the substrate; and
supplying a reactive gas onto the yttrium source adsorption layer.

3. The method as claimed in claim 2, wherein:
the reactive gas is an oxidizing gas, and
forming the yttrium-containing film includes forming an yttrium oxide film.

4. The method as claimed in claim 1, further comprising forming a lower structure on the substrate prior to forming the yttrium-containing film,
wherein:

the yttrium-containing film is formed to be in contact with the lower structure, and the lower structure includes a conductive film.

5. The method as claimed in claim 1, further comprising forming a lower structure on the substrate prior to forming the yttrium-containing film, wherein:

the yttrium-containing film is formed to be in contact with the lower structure, and the lower structure includes an insulating film.

6. The method as claimed in claim 1, wherein, in General Formula (I), at least one of $R^2$ and $R^3$ is a $C_3$-$C_4$ branched alkyl group.

7. The method as claimed in claim 1, wherein, in General Formula (I), n is 0 or 1.

8. The method as claimed in claim 1, wherein, in General Formula (I):

a number of carbon atoms in $R^4$ is less than a number of carbon atoms in $R^2$, and the number of carbon atoms in $R^4$ is less than a number of carbon atoms in $R^3$.

9. The method as claimed in claim 1, wherein, in General Formula (I), $R^4$ is a hydrogen atom or a methyl group.

10. The method as claimed in claim 1, wherein, in General Formula (I), a number of carbon atoms in $R^2$ is different from a number of carbon atoms in $R^3$.

11. The method as claimed in claim 1, wherein, in General Formula (I):

one of $R^2$ and $R^3$ is a $C_3$-$C_4$ branched alkyl group, and another one of $R^2$ and $R^3$ is a $C_1$-$C_4$ linear alkyl group.

\* \* \* \* \*